(12) United States Patent
Shintani et al.

(10) Patent No.: US 6,756,312 B2
(45) Date of Patent: Jun. 29, 2004

(54) METHOD OF FABRICATING A SEMICONDUCTOR DEVICE INCLUDING TIME-SELECTIVE ETCHING PROCESS

(75) Inventors: Kenji Shintani, Hyogo (JP); Mutsumi Tsuda, Hyogo (JP); Masakazu Taki, Hyogo (JP); Hiroki Ootera, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 295 days.

(21) Appl. No.: 09/934,453

(22) Filed: Aug. 22, 2001

(65) Prior Publication Data

US 2002/0052120 A1 May 2, 2002

(30) Foreign Application Priority Data

Aug. 28, 2000 (JP) .................................. 2000-256772
Mar. 19, 2001 (JP) .................................. 2001-077664
Aug. 9, 2001 (JP) .................................. 2001-242352

(51) Int. Cl.$^7$ .......................................... H01L 21/302
(52) U.S. Cl. .................................. 438/706; 438/714
(58) Field of Search .......................... 438/706, 710, 438/714, 723, 720

(56) References Cited

U.S. PATENT DOCUMENTS 6,025,892 A * 2/2000 Kawai et al. .................. 349/43
6,144,087 A * 11/2000 Satoh .......................... 257/530
6,479,392 B2 * 11/2002 Yamazaki et al. ........... 438/710
6,627,554 B1 * 9/2003 Komada ...................... 438/710

OTHER PUBLICATIONS

Watanabe et al., "Selective Etching Of Phosphosilicate Glass With Low Pressure Vapor HF", Journal of the Electrochemical Society, vol. 142, No. 1. Jan. 1995, pp. 237–243.

Wong et al., "Characterization Of Wafer Cleaning And Oxide Etching Using Vapor–Phase Hydrogen Fluoride", Journal of the Electrochemical Society, vol. 138, No. 8, Jun. 1991, pp. 1799–1802.

Miki et al., "Gas–Phase Selective Etching Of Native Oxide", IEEE Transactions on Electron Devices, vol. 37, No. 1, Jan. 1990, pp. 107–115.

* cited by examiner

Primary Examiner—Kin-Chan Chen
(74) Attorney, Agent, or Firm—Leydig, Voit & Mayer, Ltd.

(57) ABSTRACT

In a wafer treatment apparatus, a hydrofluoric acid gas supply pipe and an evacuation pipe are connected to a chamber storing a wafer for performing prescribed treatment. A control part is provided for controlling supply of hydrofluoric acid gas. The control part sets a time for supplying the hydrofluoric acid gas into the chamber to be longer than a time up to starting of etching of a reaction product and shorter than a time up to starting of etching of a gate insulator film. Thus, only the reaction product can be substantially etched without etching the gate insulator film.

18 Claims, 15 Drawing Sheets

TIME AFTER STARTING SUPPLYING HYDROFLUORIC ACID GAS INTO CHAMBER

US 6,756,312 B2

METHOD OF FABRICATING A SEMICONDUCTOR DEVICE INCLUDING TIME-SELECTIVE ETCHING PROCESS

BACKGROUND OF THE INVENTION

1. Field of the Invention

The present invention relates to a method of fabricating a semiconductor device and a wafer treatment apparatus employed therefor as well as a semiconductor device and a cleaning method after formation of a gate electrode, and more particularly, it relates to a method of fabricating a semiconductor device capable of attaining high etching selectivity and a cleaning method after formation of a gate electrode, a wafer treatment method employed for the fabrication method or the cleaning method and a semiconductor device obtained by the fabrication method.

2. Description of the Prior Art

High performance is required particularly in a transistor employed for a logic circuit or a system LSI (large-scale integrated circuit) among semiconductor devices. In order to satisfy this requirement, the thickness of a gate insulation film of the transistor is set to not more than 3 nm. Further, a development has recently been made for reducing the thickness of the gate insulating film below 2 nm.

In etching for forming a gate electrode of the transistor, a conductive layer for defining the gate electrode is substantially etched under a condition having high selectivity for the gate insulator film, thereby preventing the thin gate insulator film from etching.

In the etching for forming the gate electrode, a reaction product resulting from the etching adheres to the surfaces of the side walls of the gate electrode and the surface of a mask member for patterning the gate electrode. It has been recognized by observation with an SEM (scanning electron microscope) that such a reaction product adheres to the surfaces substantially in a conformal state. In order to ensure reliability of a semiconductor device, such a reaction product adhering to the surface of the gate electrode must be removed.

In order to remove such a reaction product, wet cleaning employing a chemical solution is generally performed. An exemplary method of fabricating a semiconductor device including this wet cleaning is now described.

First, an insulator film for defining a gate insulator film is formed on a semiconductor substrate. A polysilicon film for defining a gate electrode is formed on the insulator film. A silicon oxide film for defining a mask member for forming the gate electrode is formed on the polysilicon film. The silicon oxide film is subjected to prescribed etching, for forming the mask member.

The polysilicon film is etched through the mask member in an atmosphere prepared by converting a gas mixture containing $Cl_2$ and $O_2$ or HBr, $Cl_2$ and $O_2$, for example, into a plasma, patterning the gate electrode. In this patterning, a reaction product adheres to the side wall surfaces of the gate electrode and the surface of the mask member. After formation of the gate electrode, the reaction product adhering to the gate electrode is removed by wet cleaning.

It is known that the reaction product is mainly composed of a silicon oxide such as $SiO_xCl_y$ or $SiO_xBr_y$ when the polysilicon film is etched by converting the gas mixture containing $Cl_2$ and $O_2$ or HBr, $Cl_2$, and $O_2$ to a plasma.

Therefore, the reaction product is removed by dipping the semiconductor substrate in a cleaning solution of diluted hydrofluoric acid (DHF) or aqueous ammonia peroxyhydrate ($NH_4OH+H_2O_2+H_2O$:APM), for example. Thus, the reaction product is removed for forming the gate electrode.

After the reaction product is removed, the mask member remaining on the gate electrode must be removed in order to electrically connect the gate electrode with a wire through a tungsten plug embedded in a contact hole, for example.

This mask member is formed by a silicon oxide film such as a TEOS (tetraethyl orthosilicate glass) oxide film. Therefore, the mask member consisting of the silicon oxide film is removed by diluted hydrofluoric acid, for example. Thus, the silicon oxide film serving as the mask member is removed for forming the gate electrode.

However, the conventional method of fabricating a semiconductor device has the following problems:

As hereinabove described, the reaction product adhering to the surfaces of the side walls of the gate electrode and the like when forming the gate electrode is mainly composed of a silicon oxide such as $SiO_xCl_y$ or $SiO_xBr_y$. The gate insulator film also consists of a silicon oxide obtained by oxidizing the silicon substrate.

When the reaction product is removed by the cleaning solution of diluted hydrofluoric acid (DHF) or aqueous ammonia peroxyhydrate (APM), therefore, the gate insulator film is also etched.

Therefore, a gate insulator film 102 located between a silicon substrate 101 and a gate electrode 103 may be partially etched to expose a corner portion of the gate electrode 103, as shown in a circle 105 in FIG. 27, for example.

Therefore, a current leaks from the exposed corner portion of the gate electrode 103 to deteriorate electric characteristics of the transistor, disadvantageously resulting in reduction of reliability of the semiconductor device.

When a reaction product is removed with aqueous ammonia peroxyhydrate (APM) in a gate electrode 103 having a polycide structure formed by a polysilicon film 103a and a tungsten silicide film 103b as shown in FIG. 28, for example, a side wall portion of the tungsten silicide film 103b may be also etched (side-etched) in addition to a gate insulator film 102 (a portion in a circle 105).

In this case, the etched portion may not be fully filled but produce a void when the gate electrode 103 is covered with an interlayer isolation film, and reduce the reliability of the semiconductor device.

Further, the silicon oxide film serving as the mask member is removed by diluted hydrofluoric acid, as hereinabove described. However, the gate insulator film 102, also formed by a silicon oxide film, is simultaneously etched when the mask member is removed.

Therefore, the gate insulator film 102 located between the silicon substrate 101 and the gate electrode 103 may be partially etched to expose another corner portion located under the gate electrode 103, as shown in a circle 105 in FIG. 29.

Consequently, the current leaks from the exposed corner portion 105 located under the gate electrode 103, to disadvantageously deteriorate the electric characteristics of the transistor similarly to the case of removing the reaction product.

SUMMARY OF THE INVENTION

The present invention has been proposed in order to solve the aforementioned problems, and an object thereof is to provide a method of fabricating a semiconductor device attaining high selectivity in etching. Another object of the present invention is to provide a wafer treatment apparatus employed for such a method of fabricating a semiconductor device. Still another object of the present invention is to provide a semiconductor device obtained by such a method of fabricating a semiconductor device.

A method of fabricating a semiconductor device according to a first aspect of the present invention comprises a wafer treatment step performing prescribed treatment on a first part having a prescribed etching property and a second part having an etching property different from the prescribed etching property, which are formed on a semiconductor substrate, in a chamber with gas for etching. The wafer treatment step includes an etching gas supply step of introducing the gas for etching into the chamber. Assuming that a time between introduction of the gas for etching into the chamber and starting of etching of the first part is referred to as a first starting time and a time between introduction of the gas for etching into the chamber and starting of etching of the second part is referred to as a second starting time longer than the first starting time, a time for carrying out the etching gas supply step is longer than the first starting time and shorter than the second starting time.

According to this method, the time for carrying out the etching gas supply step is longer than the first starting time and shorter than the second starting time, whereby only the first part is etched before etching of the second part is started. Consequently, the first part can be selectively etched substantially without etching the second part.

More specifically, the time difference between the first starting time and the second starting time is preferably not more than about 5 seconds.

In this case, only a reaction product can be selectively and efficiently removed without etching a gate insulator film, for example, as described later.

Preferably, the method of fabricating a semiconductor device further comprises steps of forming an insulator film on the semiconductor substrate and forming a conductive region on the insulator film, the step of forming the insulator film includes a step of forming a gate insulator film, the step of forming the conductive region includes a step of forming a gate electrode part on the gate insulator film, the first part contains a reaction product generated before forming the gate electrode part for covering the surface of the gate insulator film and the surface of the gate electrode part, the second part includes the gate insulator film, and the gas for etching includes hydrofluoric acid gas.

In this case, the reaction product adhering when forming the gate electrode part can be selectively etched substantially without etching the gate insulator film so that the reaction product can be selectively removed.

Preferably, the wafer treatment step includes an added gas supply step of introducing reaction accelerating gas for further reducing the first starting time into the chamber before the etching gas supply step.

In this case, the reaction accelerating gas reduces the first starting time, thereby increasing the time for etching the first part. Consequently, the time for the wafer treatment step can be reduced.

More preferably, the added gas supply step and the etching gas supply step are alternately carried out in the wafer treatment step.

When the added gas supply step and the etching gas supply step are alternately carried out, the first part can be reliably selectively removed while leaving the second part.

Preferably, the added gas supply step is continuously carried out also after the etching gas supply step is started in the wafer treatment step.

In this case, the etching rate in the etching gas supply step can be improved for reducing the time for the wafer treatment step.

Preferably, the wafer treatment step includes an evacuation step of evacuating the chamber, and the evacuation step is not carried out at least while the etching gas supply step is carried out.

In this case, the internal pressure of the chamber is increased in the etching gas supply step as compared with the case of regularly carrying out the evacuation step, so that the first part can be effectively etched.

Preferably, the method of fabricating a semiconductor device further comprises steps of forming a conductive layer on the semiconductor substrate through a gate insulator film, forming a layer for defining a mask on the conductive layer, etching the conductive layer through a mask of the layer for defining a mask thereby forming a gate electrode and removing the layer for defining a mask remaining on the gate electrode after formation of the gate electrode, while the wafer treatment step includes a step of removing the layer for defining a mask, the first part includes the layer for defining a mask, the second part includes the gate insulator film, and hydrofluoric acid gas is supplied as etching gas in the etching gas supply step.

In this case, the layer for defining a mask can be selectively etched substantially without etching the gate insulator film when removing the layer for defining a mask employed for patterning the gate electrode, for selectively removing the layer for defining a mask.

Preferably, the etching gas supply step is repetitively carried out in the wafer treatment step.

If the layer for defining a mask cannot be removed by single etching, therefore, the layer for defining a mask can be reliably removed without etching the gate insulator film by repeating the etching gas supply step.

More preferably, the wafer treatment step includes an evacuation step evacuating the chamber, and the etching gas supply step and the evacuation step are alternately carried out.

Thus, the pressure in the chamber is increased in the etching gas supply step, so that the layer for defining a mask can be effectively etched.

A semiconductor device according to a second aspect of the present invention is fabricated by the method of fabricating a semiconductor device according to the first aspect.

According to this semiconductor device, the first part is selectively etched with respect to the second part, whereby a reaction product adhering when forming the gate electrode, for example, can be removed substantially without etching the gate insulator film. Further, the layer for defining a mask for forming the gate electrode can be removed substantially without etching the gate insulator film. Consequently, the semiconductor device can be prevented from deterioration of electric characteristics.

A wafer treatment apparatus according to a third aspect of the present invention is employed for performing prescribed treatment on a first part having a prescribed etching property and a second part having an etching property different from said prescribed etching property, which are formed on a wafer, with gas for etching, and comprises a chamber, an etching gas supply part and a control part. The chamber stores the wafer. The etching gas supply part supplies the gas for etching into the chamber. The control part controls supply of the gas for etching from the etching gas supply part into the chamber. Assuming that a time between introduction of the gas for etching into the chamber and starting of etching of the first part is referred to as a first starting time and a time between introduction of the gas for etching into the chamber and starting of etching of the second part is referred to as a second starting time longer than the first starting time, the control part has a function of supplying the gas for etching from the etching gas supply part into the chamber by a time longer than the first starting time and shorter than the second starting time.

According to this wafer treatment apparatus, only the first part is etched before etching of the second part is started so that the first part can be selectively etched substantially without etching the second part. Thus, only a reaction product adhering when forming a gate electrode of a semiconductor device, for example, can be selectively removed by etching substantially without etching a gate insulator film, for preventing the semiconductor device from deterioration of electric characteristics.

Particularly when the time difference between the first starting time and the second starting time is not more than about 5 seconds, the first part can be reliably selectively etched in the wafer treatment apparatus.

Preferably, the wafer treatment apparatus further comprises an added gas supply part supplying reaction accelerating gas for reducing the first starting time into the chamber, and the control part includes a function of supplying the reaction accelerating gas from the added gas supply part into the chamber before supplying the gas for etching.

In this case, the reaction gas accelerating gas reduces the first starting time, thereby increasing the time for etching the first part. Consequently, the time for treatment is reduced and the throughput of the wafer treatment can be improved.

Preferably, the control part includes a function of alternately supplying the gas for etching and the reaction accelerating gas.

In this case, supply of the gas for etching and supply of the reaction accelerating gas are so alternately carried out that the first part is repetitively etched and can be reliably selectively removed while leaving the second part.

Further preferably, the control part includes a function of supplying the reaction accelerating gas also while supplying the gas for etching.

In this case, the reaction accelerating gas is supplied while the gas for etching is supplied, whereby the etching rate for etching the first part can be improved. Thus, the time for the treatment is reduced and the throughput of the wafer treatment apparatus can be improved.

Preferably, the wafer treatment apparatus further comprises an evacuation part evacuating the chamber, and the control part includes a function of not operating the evacuation part at least while supplying the etching gas.

In this case, the internal pressure of the chamber supplied with the etching gas is increased as compared with the case of regularly evacuating the chamber, so that the first part can be effectively etched.

A cleaning method after formation of a gate electrode according to a fourth aspect of the present invention removes a reaction product formed by etching with hydrofluoric acid gas after forming a gate electrode patterned by etching with a mask on a semiconductor substrate through a gate insulating film.

According to this cleaning method after formation of a gate electrode, the reaction product can be removed without scraping the gate insulator film.

Preferably, the gate electrode consists of a film containing at least silicon.

In this case, a reaction product resulting from formation of the gate electrode consisting of the film containing silicon is mainly composed of a silicon oxide, and can be reliably removed with the hydrofluoric acid gas without removing the gate insulator film.

Preferably, the time for removing the reaction product with the hydrofluoric acid gas is within the reaction time difference between a time when the reaction product is scraped by the hydrofluoric acid gas and a time when the gate insulator film is scraped.

In this case, only the reaction product can be removed without scraping the gate insulator film.

Further preferably, the reaction time difference is repetitively set thereby removing the reaction product with the hydrofluoric acid gas.

In this case, only the reaction product can be reliably removed. More specifically, the semiconductor substrate formed with the gate electrode is set in a chamber, and the reaction time difference is repetitively set by repeating steps of evacuating the chamber and charging the chamber with the hydrofluoric acid gas.

Preferably, a set temperature for removing the reaction product with the hydrofluoric acid gas is set to a level lower than 40° C.

In this case, reduction of the reaction time difference is so suppressed that only the reaction product can be relatively readily removed. The lower limit of the aforementioned set temperature is preferably about the room temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
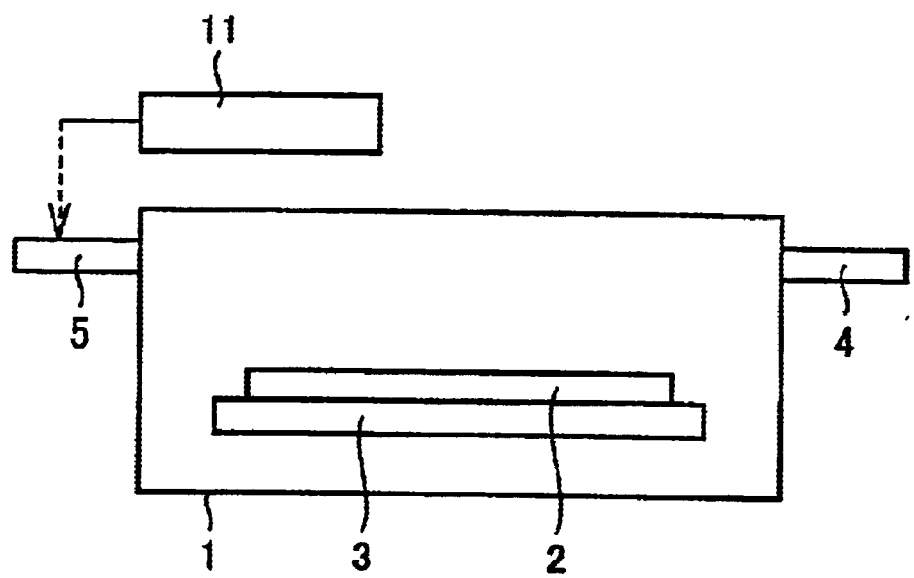
FIG. 1 is a sectional view showing a wafer treatment apparatus according to a first embodiment of the present invention.

A wafer treatment apparatus and a method of fabricating a semiconductor device with the wafer treatment apparatus according to a first embodiment of the present invention are now described. As shown in FIG. 1, the wafer treatment apparatus according to the first embodiment has a chamber 1 for storing a wafer 2 and performing prescribed treatment on the wafer 2. A stage 3 for holding the wafer 2 is provided in the chamber 1. A hydrofluoric acid gas supply pipe 5 and an evacuation pipe 4 are connected to the chamber 1. The hydrofluoric acid gas supply pipe 5 supplies hydrofluoric acid gas into the chamber 1. The evacuation pipe 4 evacuates the chamber 1. The wafer treatment apparatus further has a control part 11 controlling supply of the hydrofluoric acid gas.

Figure 2:
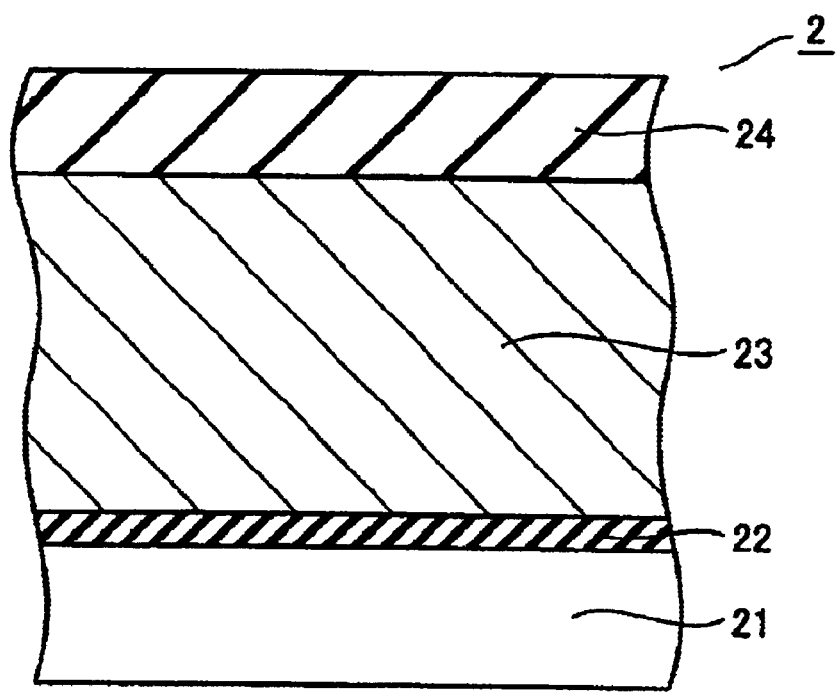
FIG. 2 is a sectional view showing a step in a method of fabricating a semiconductor device according to the first embodiment.

An exemplary method of fabricating a semiconductor device with the aforementioned wafer treatment apparatus is now described. As shown in FIG. 2, a silicon oxide film 22 for defining a gate insulator film (up to 2 nm) is formed on a silicon substrate 1 by thermal oxidation, for example. A polysilicon film 23 for defining a gate electrode (up to 200 nm) is formed on the silicon oxide film 22 by CVD, for example. A silicon oxide film 24 for defining a mask member (up to 50 nm) is formed on the polysilicon film 23 by CVD, for example.

Figure 3:
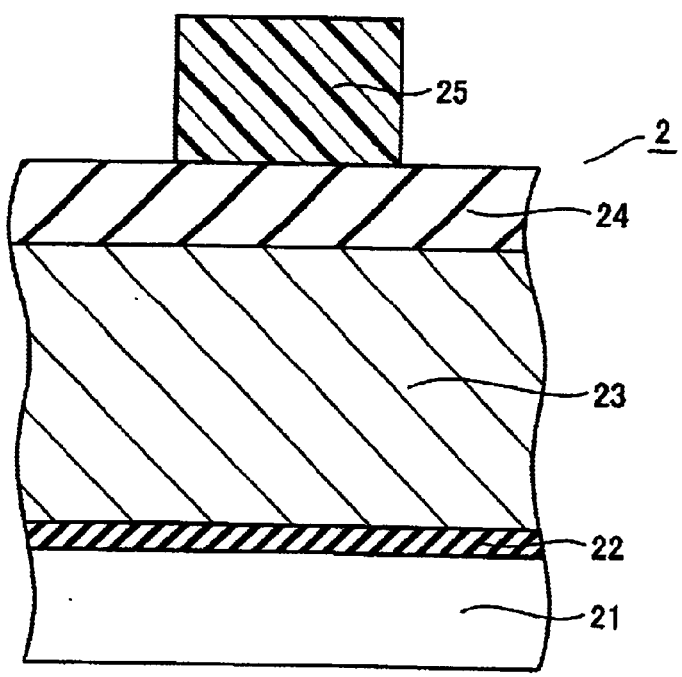
FIG. 3 is a sectional view showing a step carried out after the step shown in FIG. 2 in the first embodiment.
Figure 4:
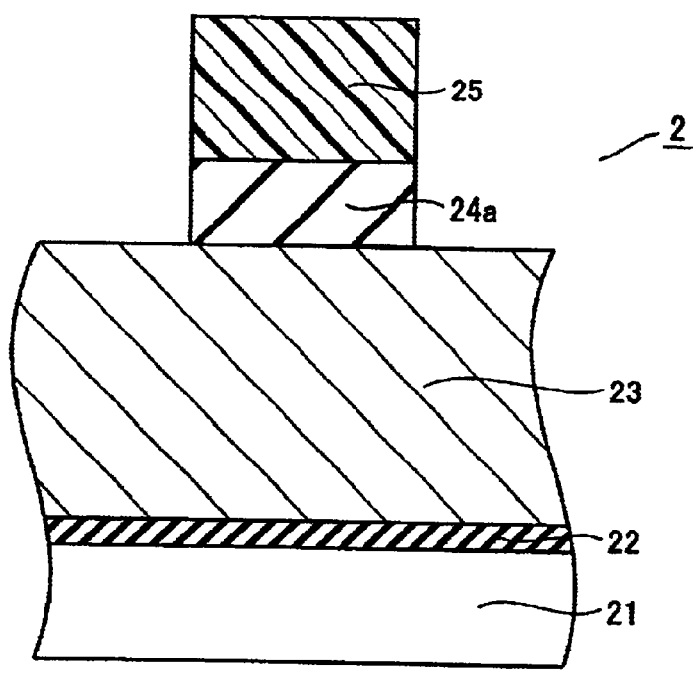
FIG. 4 is a sectional view showing a step carried out after the step shown in FIG. 3 in the first embodiment.

As shown in FIG. 3, a resist pattern 25 for forming the mask member is formed on the silicon oxide film 24. As shown in FIG. 4, the silicon oxide film 24 is etched through the resist pattern 25 serving as a mask, thereby forming an oxide film mask 24a for patterning the gate electrode. Thereafter the resist pattern 25 is removed.

Figure 5:
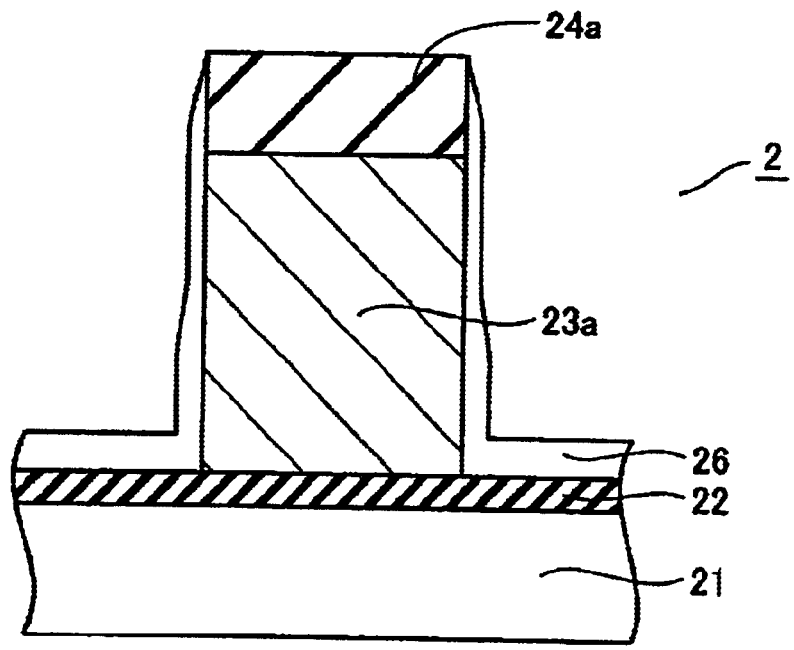
FIG. 5 is a sectional view showing a step carried out after the step shown in FIG. 4 in the first embodiment.

As shown in FIG. 5, the polysilicon film 23 is etched through the oxide film mask 24a in an atmosphere prepared by converting a gas mixture containing $Cl_2$ and $O_2$ or HBr, $Cl_2$ and $O_2$, for example, to plasma thereby forming a gate electrode 23a. In this etching, a reaction product 26 adheres to the side wall surfaces of the gate electrode 23a, the surface of the oxide film mask 24a and the like.

Then, the adhering reaction product 26 is removed by the wafer treatment apparatus. First, the silicon substrate 21 is placed on the stage 3 as the wafer 2, as shown in FIG. 1. Then, the evacuation pipe 4 evacuates the chamber 1 and brings the same into a prescribed vacuum state. Thereafter the control part 11 controls the hydrofluoric acid gas supply pipe 5 to supply hydrofluoric acid gas into the chamber 1 for bringing the hydrofluoric acid gas into contact with the wafer 2.

Figure 6:
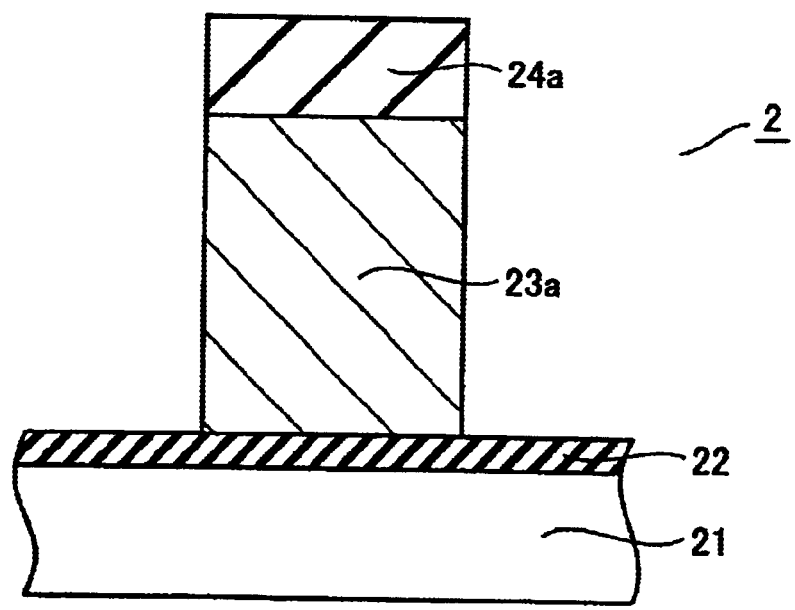
FIG. 6 is a sectional view showing a step carried out after the step shown in FIG. 5 in the first embodiment.

The fluoric acid gas coming into contact with the wafer 2 reacts with the reaction product 26 thereby etching the reaction product 26 and removing the same from the side wall surfaces of the gate electrode 23a and the like, as described later. Thus, the gate electrode 23a from which the reaction product 26 is removed is formed as shown in FIG. 6.

Figure 7:
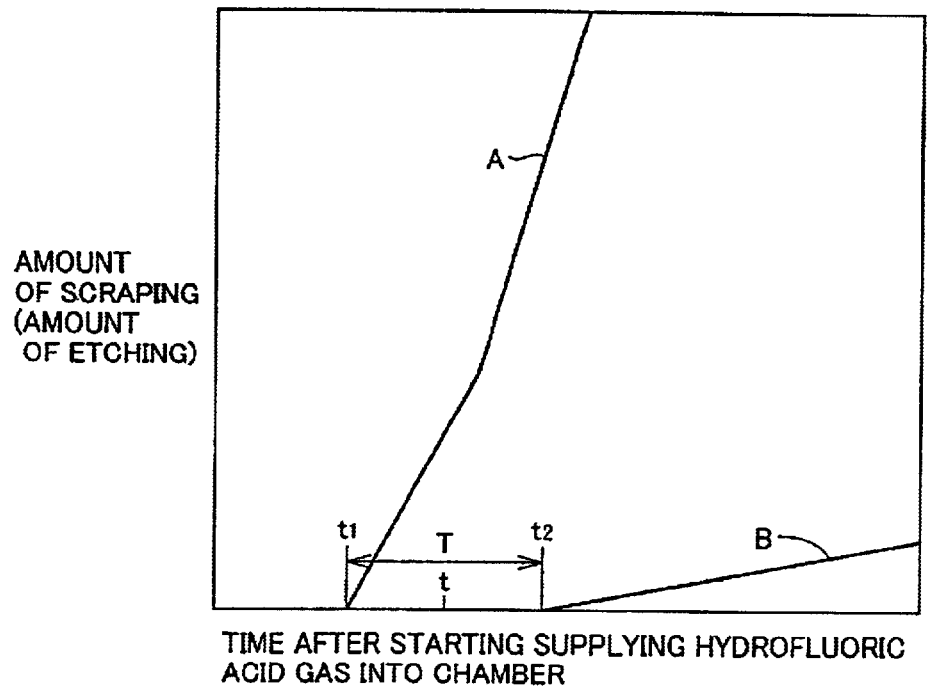
FIG. 7 is a graph showing amounts of scraping of a reaction product and a gate insulator film with respect to an elapsed time from introduction of hydrofluoric acid gas into a chamber in the first embodiment.

In the aforementioned method of fabricating a semiconductor device, the reaction product 26 adhering to the surface of the gate electrode 23a and the like is removed (cleaned) by the wafer treatment apparatus. This removal is now described in detail. As shown in FIG. 7, there is time difference T (t2−t1) between a time t1 between supply of the hydrofluoric acid gas into the chamber 1 and starting of etching (graph A) of the reaction product 26 and a time t2 between supply of the hydrofluoric acid gas and starting of etching (graph B) of the silicon oxide film 22 for defining the gate insulator film. In other words, etching of the reaction product 26 is precedently started.

This time difference T conceivably results from the following: It is known that the reaction product 26 is mainly composed of a silicon oxide such as $SiO_xCl_y$ or $SiO_xBr_y$ when the polysilicon film 23 is etched by converting a gas mixture containing $Cl_2$ and $O_2$ or HBr, $Cl_2$ and $O_2$ to plasma for forming the gate electrode 23a, as hereinabove described.

When the reaction product 26 consisting of a silicon oxide and the hydrofluoric acid gas react with each other, water ($H_2O$) is generated. When this reaction so progresses that the amount of the generated water exceeds a certain level, the rate of etching (scraping) is abruptly increased. Comparing the reaction product 26 and the silicon oxide film 22 with each other, this reaction more rapidly progresses on the reaction product 26 than on the silicon oxide film 22.

Therefore, the time t1 required by the water generated by reaction of the hydrofluoric acid gas and the reaction product 26 to reach a certain amount is shorter than the time t2 required by the water generated by reaction of the hydrofluoric acid gas and the silicon oxide film 22 to reach the certain amount. It is conceivable that etching of the reaction product 26 consequently starts precedently to etching of the silicon oxide film 22.

When a time t for supplying the hydrofluoric acid gas into the chamber 1 is set to be longer than the time t1 up to starting of etching of the reaction product 26 and shorter than the time t2 up to starting of etching of the silicon oxide film 22 for defining the gate insulator film as shown in FIG. 7, therefore, only the reaction product 26 can be selectively etched substantially without etching the silicon oxide film 22.

Thus, the reaction product 26 is etched substantially by a time corresponding to the difference between the times t and t1. When the time t for supplying the hydrofluoric acid gas is extended to the time t2, the reaction product 26 is etched by a time corresponding to the maximum time difference T between the times t1 and t2.

At this time, the silicon oxide film 22 is not etched, and hence the silicon substrate 21 is not damaged. The times t1 and t2 are preferably previously obtained by an experiment.

Further, it has been proven that reaction between hydrofluoric acid gas and a reaction product or the like has temperature dependency and that the time difference T is unpractically reduced when the temperature in the chamber 1 is set in excess of 40° C.

Thus, it has been proven that the temperature in the chamber 1 is preferably set to at least the room temperature and less than 40° C., in order to etch the reaction product 26 with sufficient selectivity with respect to the silicon oxide film 22.

In the aforementioned method of fabricating a semiconductor device, the gate electrode 23a is formed by the polysilicon film 23. However, it has been proven that, also when the gate electrode 23a has a polycide structure formed by a polysilicon film and a metal silicide film or the like, for example, reaction between the hydrofluoric acid gas and the metal silicide film or the like hardly progresses and the side surfaces of the gate electrode 23a are not etched (side-etched).

Thus, no voids are caused when the gate electrode 23a is covered with an interlayer isolation film but the semiconductor device is improved in reliability.

Second Embodiment

Figure 8:
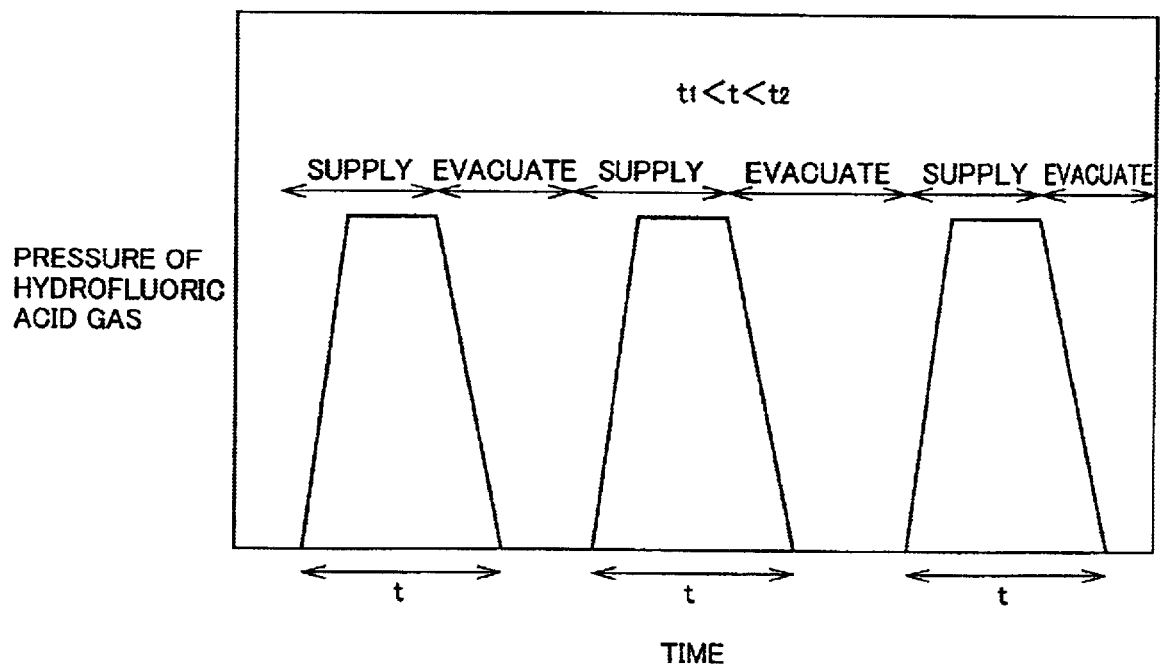
FIG. 8 is a diagram for illustrating a method of fabricating (cleaning) a semiconductor device according to a second embodiment of the present invention.

A method of fabricating a semiconductor device according to a second embodiment of the present invention is now described. It may be difficult to completely remove the reaction product 26 through etching by the time corresponding to the time difference T described with reference to the first embodiment. In this case, the reaction product 26 can be substantially completely removed by repeating introduction of the hydrofluoric acid gas and evacuation, as shown in FIG. 8. This is now described.

In the step shown in FIG. 5 described with reference to the first embodiment, hydrofluoric acid gas is introduced (first time) into the chamber 1 by a time t longer than the time t1 up to starting of etching of the reaction product 26 and shorter than the time t2 up to starting of etching of the silicon oxide film 22, as shown in FIG. 8. The pressure of hydrofluoric acid gas stored in the chamber 1 is increased due to this introduction. Thus, only the reaction product 26 is selectively etched substantially without etching the silicon oxide film 22. Thereafter supply of the hydrofluoric acid gas is stopped.

Then, the chamber 1 is evacuated through the evacuation pipe 4 and the inner part of the chamber 1 as well as the surface of the wafer 2 are cleaned, as shown in FIG. 8. The pressure of the hydrofluoric acid gas is reduced due to this evacuation of the chamber 1. Further, water resulting from reaction between the hydrofluoric acid gas and the reaction product 26 is removed. Then, hydrofluoric acid gas is introduced (second time) into the chamber 1 again by the aforementioned prescribed time t. Thus, the remaining reaction product 26 is selectively removed similarly to the first etching with the hydrofluoric acid gas.

Thereafter the aforementioned operation (step) is repeated by a proper number of times, so that the reaction product 26 adhering to the surface of the gate electrode 23a can be substantially completely removed substantially without etching the silicon oxide film 22.

According to this embodiment, the upper limit of the time for introducing the hydrofluoric acid gas is set to the time t2 up to starting of etching of the silicon oxide film 22. When the corner potion of the lower end of the gate electrode 23a is not exposed but the leakage current can be reduced or the side surfaces of the gate electrode 23a are not etched even if the silicon oxide film 22 is slightly etched, such a time can be set as the upper limit so that the reaction product 26 can be more efficiently etched.

Third Embodiment

In the wafer treatment apparatus according to the first embodiment, the hydrofluoric acid gas is supplied for the time t longer than the time t1 up to starting of etching of the reaction product 26 and shorter than the time t2 up to starting of etching of the silicon oxide film 22.

Depending on the condition of combination of the reaction product 26 and the gate insulator film, however, the time difference T (t2−t1) may be not more than about 5 seconds. Therefore, on/off operations for introducing the hydrofluoric acid gas and evacuating the chamber 1 must be performed at a higher speed.

A third embodiment of the present invention is described with reference to a wafer treatment apparatus capable of selectively and reliably performing etching by more correctly supplying hydrofluoric acid gas and evacuating a chamber 1 when such a reaction time difference T is relatively short (not more than about 5 seconds) and a method of fabricating a semiconductor device with the wafer treatment apparatus.

Figure 9:
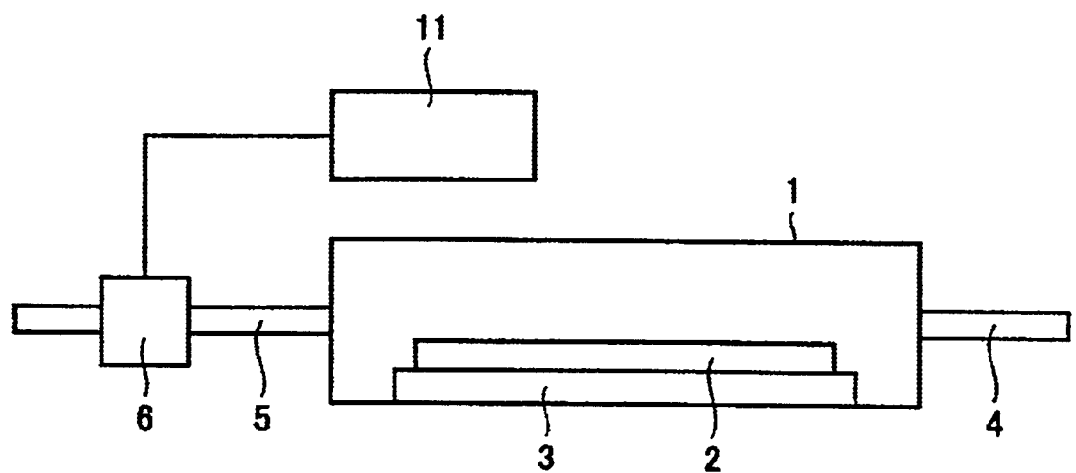
FIG. 9 is a sectional view showing a wafer treatment apparatus according to a third embodiment of the present invention.

As shown in FIG. 9, an HF supply pipe 5 is provided with a pulse valve 6 in this wafer treatment apparatus. A control part 11 controls opening/closing of the pulse valve 6 in particular. The remaining structure of this wafer treatment apparatus is similar to that of the wafer treatment apparatus shown in FIG. 1 described with reference to the first embodiment. Therefore, members identical to those shown in FIG. 1 are denoted by the same reference numerals, and redundant description is not repeated.

Hydrofluoric acid gas can be supplied into the chamber 1 by an extremely short time of several 100 microseconds to several 100 milliseconds through the pulse valve 6 and the control part 11.

Figure 10:
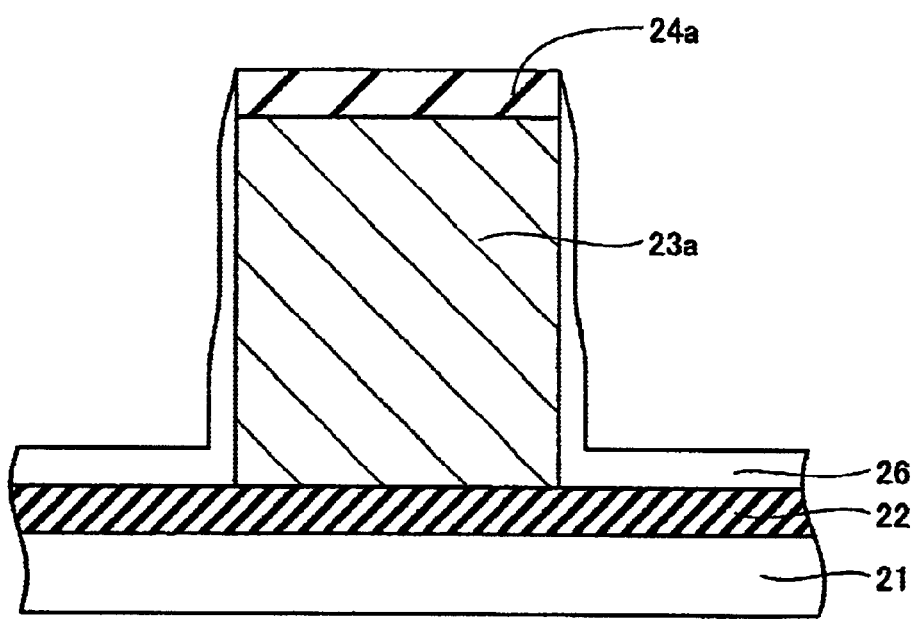
FIG. 10 is a sectional view showing a step in a method of fabricating a semiconductor device according to the third embodiment.
Figure 11:
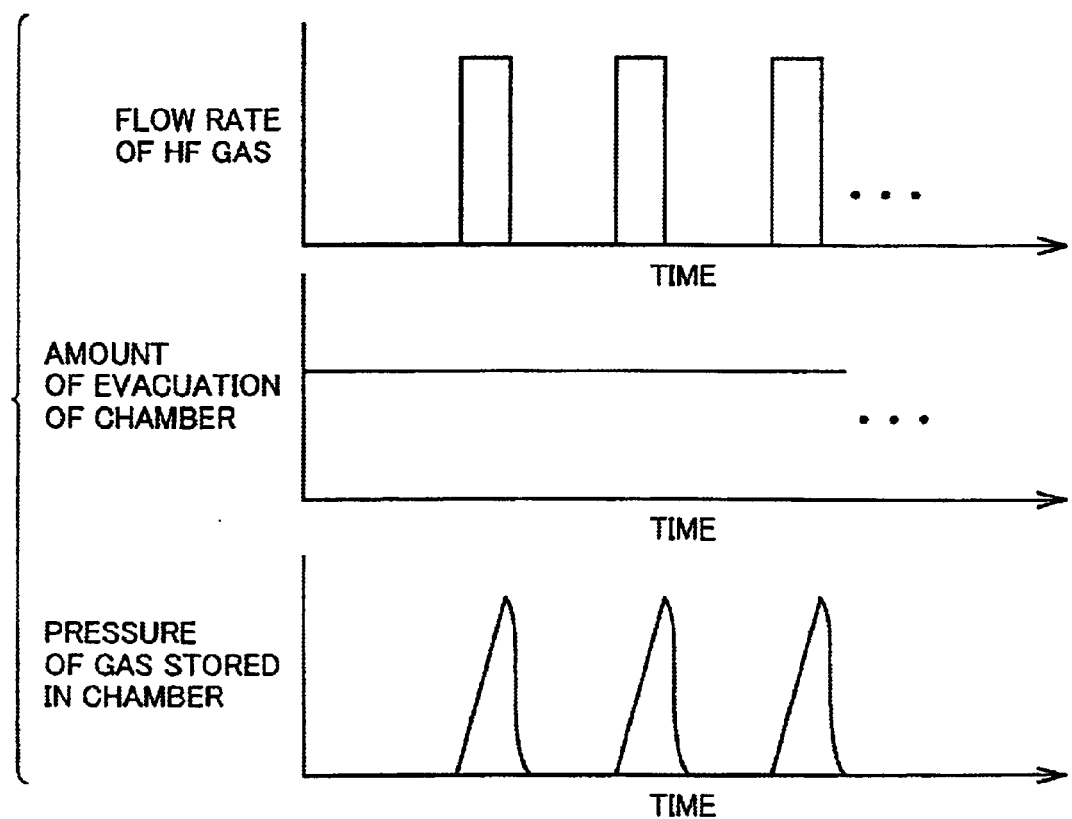
FIG. 11 is a diagram for illustrating a treatment method according to the third embodiment.

The method of fabricating a semiconductor device with this wafer treatment apparatus is now described. Steps up to that shown in FIG. 10 are similar to those shown in FIGS. 2 to 5 described with reference to the first embodiment. Thereafter a wafer to which a reaction product 26 adheres is placed on a stage of the wafer treatment apparatus.

Then, an evacuation pipe 4 is opened to evacuate the chamber 1 and bring the same into a prescribed vacuum state. Thereafter the pulse valve 6 is opened by a time t longer than a time t1 up to starting of etching of the reaction product 26 and shorter than a time t2 up to starting of etching of a silicon oxide film 22 for supplying hydrofluoric acid gas (first time) into the chamber 1. The pressure of hydrofluoric acid gas stored in the chamber 1 is increased due to this supply of the hydrofluoric acid gas.

Only the reaction product 26 is selectively etched substantially without etching the silicon oxide film 22 due to the supply of the hydrofluoric acid gas for the prescribed time. Water resulting from reaction between the hydrofluoric acid gas and the reaction product 26 is discharged from the chamber 1 through the evacuation pipe 4.

Then, the pulse valve 6 is opened by the prescribed time t again for supplying hydrofluoric acid gas (second time) into the chamber 1. Thus, the remaining reaction product 26 is selectively removed similarly to the first etching with the hydrofluoric acid gas.

Thereafter the operation (step) of the control part 1 controlling opening/closing of the pulse valve 6 is repeated by a proper number of times, thereby substantially completely removing the reaction product 26 adhering to the surface of a gate electrode 23a substantially without etching the silicon oxide film 22.

The hydrofluoric acid gas can be correctly supplied into the chamber 1 in a relatively short time by opening/closing the pulse valve 6 through the control part 11. For example, it has been confirmed through an experiment that a silicon oxide film 22 for defining a gate insulator film was etched by about 1 nm when a wafer treatment apparatus provided with no pulse valve 6 was employed for supplying hydrofluoric acid gas by about 5 seconds and stopping supply of the hydrofluoric acid gas by about 60 seconds while the silicon oxide film 22 for defining a gate insulator film was hardly etched when the wafer treatment apparatus according to this embodiment was employed for supplying hydrofluoric acid gas by about 100 milliseconds and stopping supply of the hydrofluoric acid gas for about 900 milliseconds.

While the time difference T (t2–t1) was about 1 second with respect to the reaction product 26 and the silicon oxide film 22 for defining a gate insulator film in the aforementioned case, it has been proven that the wafer treatment apparatus exhibits an excellent effect (etching selectivity) particularly when the reaction time difference T is not more than about 5 seconds.

While supply of the hydrofluoric acid gas is started/stopped through the pulse valve 6 in the wafer treatment apparatus according to this embodiment, a flow controller or the like capable of changing conductance in the hydrofluoric acid gas supply pipe 5 at a high speed may alternatively be employed. In this case, the reaction product 26 can be selectively etched and removed by reducing the flow rate of hydrofluoric acid gas flowing in a closed state of the flow controller to a degree not etching the silicon oxide film 22.

Fourth Embodiment

A fourth embodiment of the present invention is now described with reference to a wafer treatment apparatus comprising an added gas supply pipe 7 for supplying gas for prompting reaction between hydrofluoric acid gas and a reaction product 26 into a chamber 1 and a method of fabricating a semiconductor device with the wafer treatment apparatus.

Figure 12:
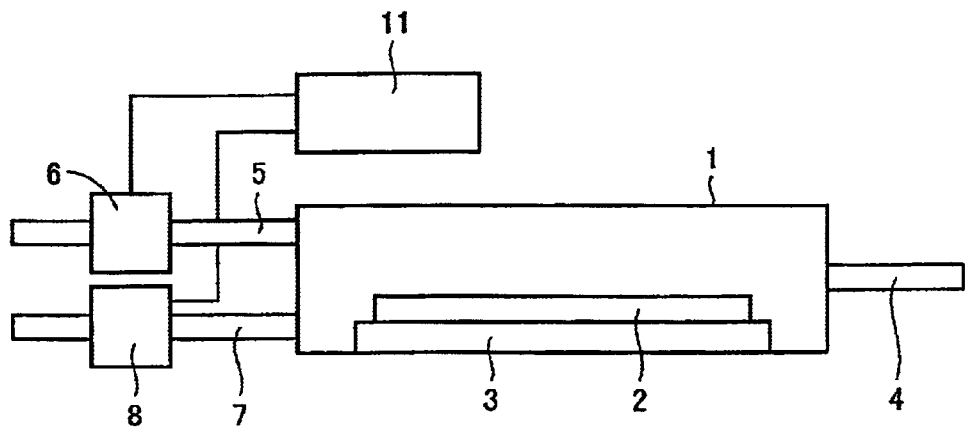
FIG. 12 is a sectional view showing a wafer treatment apparatus according to a fourth embodiment of the present invention.

As shown in FIG. 12, the added gas supply pipe 7 is connected to the chamber 1 in this wafer treatment apparatus, and the added gas supply pipe 7 is provided with a pulse valve 8. A control part 11 controls opening/closing of a pulse valve 6 as well as the pulse valve 8. The remaining structure of this wafer treatment apparatus is similar to that of the wafer treatment apparatus shown in FIG. 9 described with reference to the third embodiment. Therefore, members of the wafer treatment apparatus identical to those shown in FIG. 9 are denoted by the same reference numerals, and redundant description is not repeated.

Added gas can be supplied into the chamber 1 for an extremely short time of about several 100 microseconds to several 100 milliseconds by opening/closing the pulse valve 8.

The method of fabricating a semiconductor device with this wafer treatment apparatus is now described. After steps similar to those shown in FIGS. 2 to 5 described with reference to the first embodiment, a wafer to which the reaction product 26 adheres is placed on a stage 3 of the wafer treatment apparatus. In this wafer treatment apparatus, added gas such as water vapor, for example, is introduced into the chamber 1 before supplying hydrofluoric acid gas.

Figure 13:
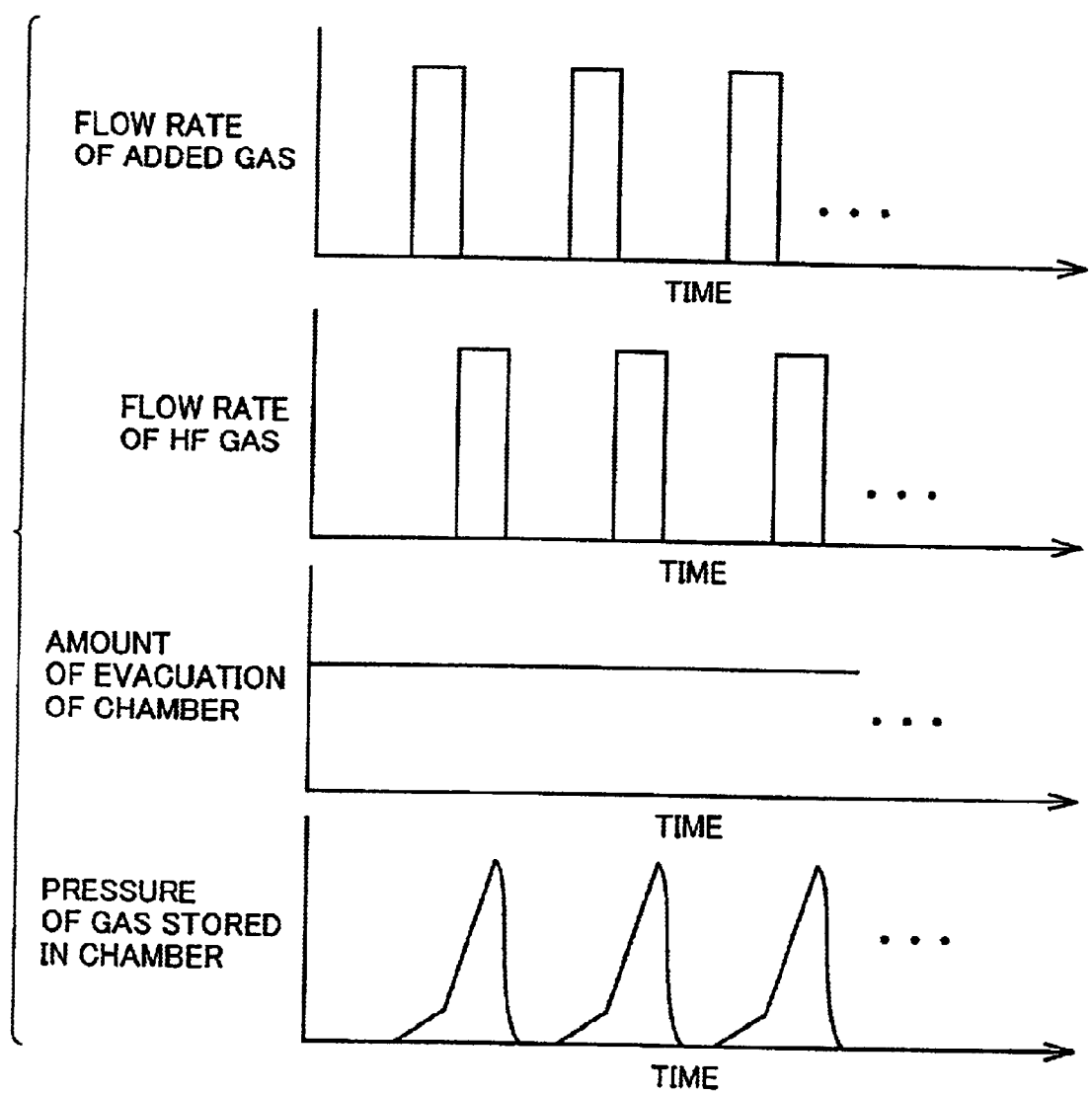
FIG. 13 is a diagram for illustrating a treatment method according to the fourth embodiment.
Figure 14:
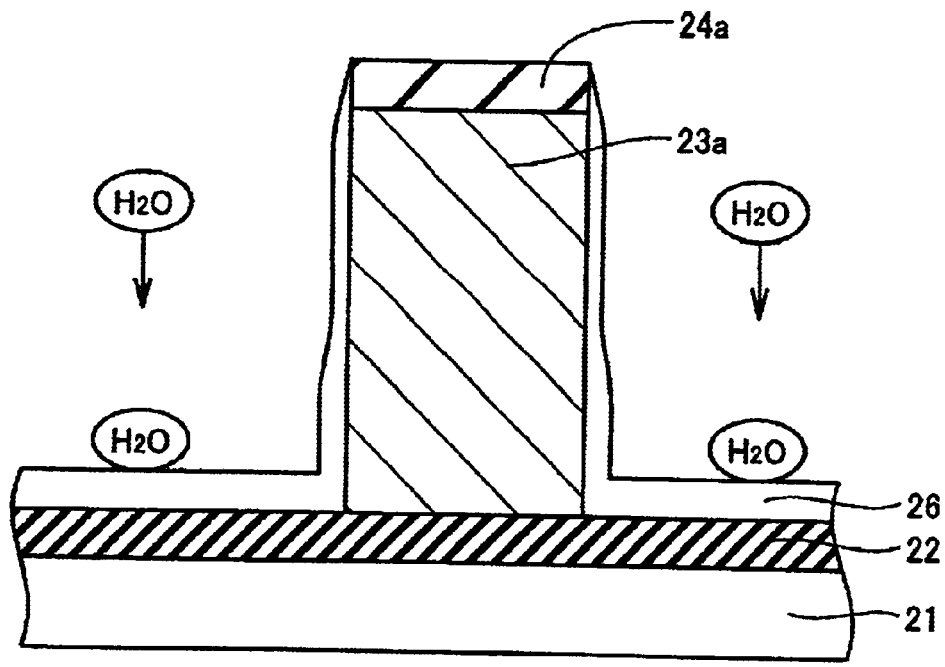
FIGS. 14 to 16 are first, second and third sectional views showing a reaction product etched in the fourth embodiment.

First, an evacuation pipe 4 is opened for evacuating the chamber 1 and bringing the same into a prescribed vacuum state. Thereafter the pulse valve 8 provided on the added gas supply pipe 7 is opened for supplying water vapor ($H_2O$) into the chamber 1 by a prescribed time, as shown in FIG. 13. The water vapor supplied into the chamber 1 is adsorbed to the surface of the reaction product 26, as shown in FIG. 14.

Then, the pulse valve 6 is opened for a time t longer than a time t1 up to starting of etching of the reaction product 26 and shorter than a time t2 up to starting of etching of a silicon oxide film 22 for supplying hydrofluoric acid gas (first time) into the chamber 1, as shown in FIG. 13. The pressure of gas stored in the chamber 1 is increased due to the introduction of the water vapor and the hydrofluoric acid gas.

Figure 15:
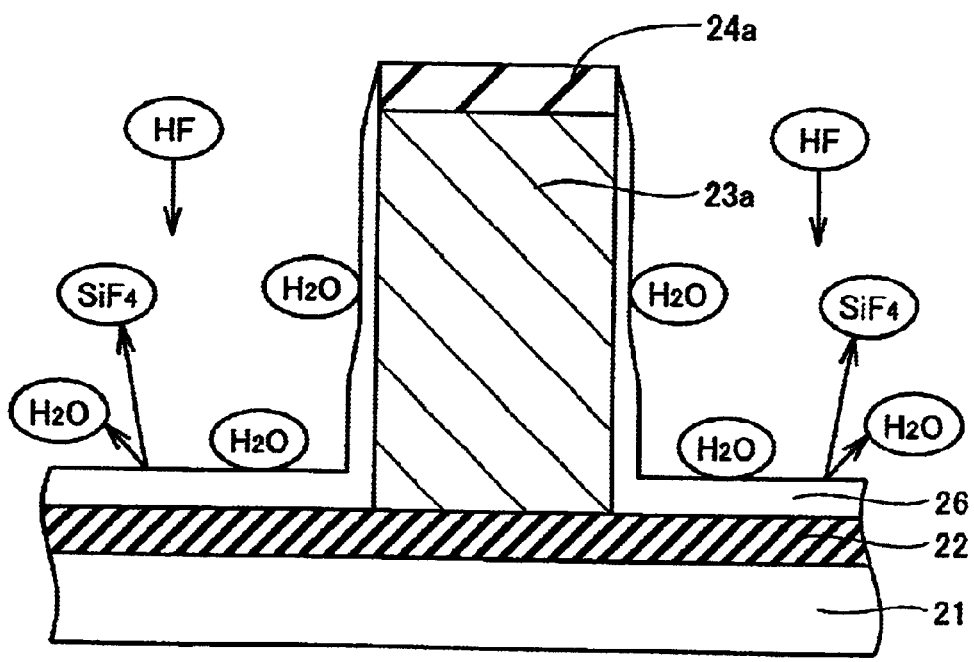
Figure 16:
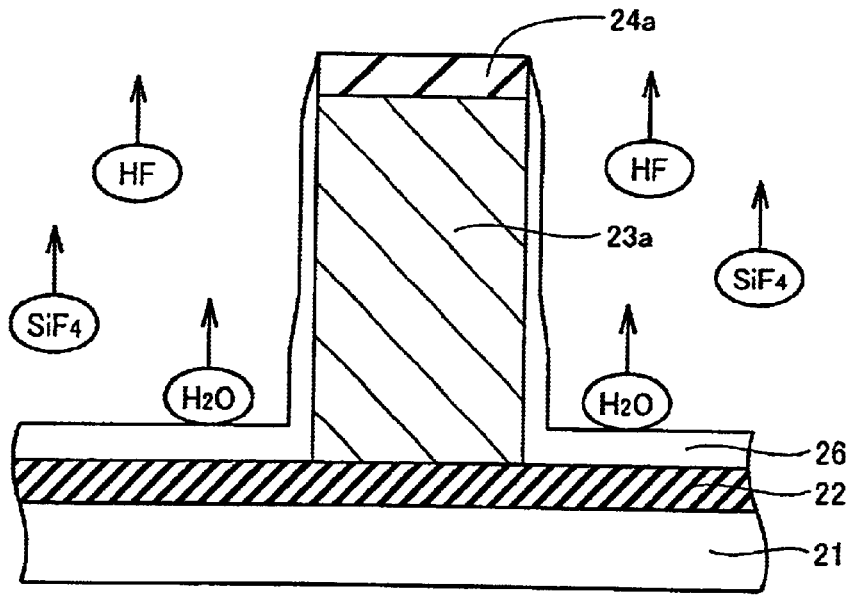

As shown in FIG. 15, the supplied hydrofluoric acid gas reacts with the reaction product 26 to generate $SiF_4$ and $H_2O$ for selectively etching the reaction product 26. As shown in FIG. 16, the generated $SiF_4$ and $H_2O$ and adsorbed water are discharged from the chamber 1 through a discharge pipe.

Then, the pulse valve 8 is opened again for supplying water vapor (second time) into the chamber 1, so that the water vapor is adsorbed to the surface of the reaction product 26. Then, the pulse valve 6 is opened again for supplying hydrofluoric acid gas (second time) into the chamber 1. Thus, the remaining reaction product 26 is selectively removed similarly to the first etching with the hydrofluoric acid gas.

The operation (step) of the control part 11 controlling opening/closing of the pulse valves 6 and 8 is repeated by a proper number of times, so that the reaction product 26 adhering to the surface of a gate electrode 23a can be substantially completely removed substantially without etching the silicon oxide film 22.

According to this wafer treatment apparatus supplying water vapor before supplying hydrofluoric acid gas, water is adsorbed to the surface of the reaction product 26. Thus, the reaction product 26 is substantially etched with ions of hydrofluoric acid (HF). Water ($H_2O$) adsorbed to the surface of the reaction product 26 prompts ionization of the hydrofluoric acid gas supplied into the chamber 1. Thus, the time t1 up to starting of etching of the reaction product 26 is reduced as compared with the case where no water is adsorbed to the surface of the reaction product 26.

The silicon oxide film 22 covered with the reaction product 26 substantially in a conformal state hardly adsorbs water. Therefore, the time t2 up to starting of etching of the silicon oxide film 22 with the hydrofluoric acid gas is hardly influenced.

Figure 17:
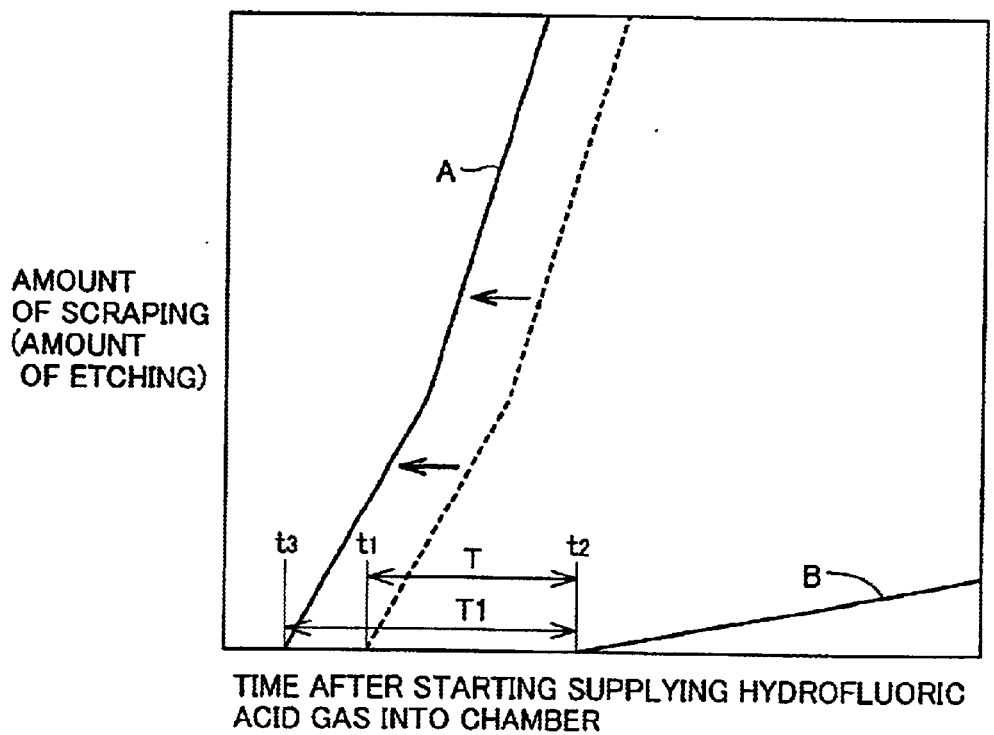
FIG. 17 is a graph showing amounts of scraping of a reaction product and a gate insulator film with respect to a time from introduction of hydrofluoric acid gas into a chamber previously containing water vapor in the fourth embodiment.

As shown in FIG. 17, the time t1 up to starting of etching of the reaction product 26 is reduced to a time t3, while the time t2 up to starting of etching of the silicon oxide film 22 remains substantially unchanged. Thus, the time for substantially etching the reaction product 26 is elongated from the time T to a time Ti, whereby the reaction product 26 can be selectively completely removed with a smaller number of times for repeating the aforementioned operation regardless of the time (e.g., t2) for supplying the hydrofluoric acid gas.

While supply of the added gas is started/stopped through the pulse valve 8 in this wafer treatment apparatus, water vapor can be adsorbed to the reaction product 26 for attaining the aforementioned effect also when employing a flow controller or the like capable of changing conductance in the added gas supply pipe 7 at a high speed.

Fifth Embodiment

A fifth embodiment of the present invention is now described with reference to a wafer treatment apparatus intermittently evacuating a chamber 1 in particular and a method of fabricating a semiconductor device with the wafer treatment apparatus.

Figure 18:
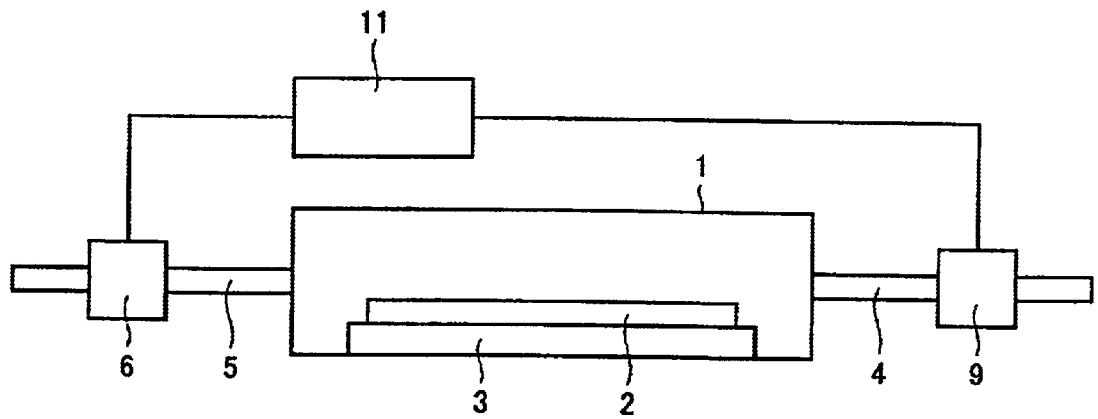
FIG. 18 is a sectional view showing a wafer treatment apparatus according to a fifth embodiment of the present invention.

As shown in FIG. 18, an evacuation pipe 4 is provided with an evacuation pulse valve 9 in this wafer treatment apparatus. A control part 11 controls opening/closing of a pulse valve 6 as well as the evacuation pulse valve 9. The remaining structure of this wafer treatment apparatus is similar to that of the wafer treatment apparatus shown in FIG. 9 described with reference to the third embodiment. Therefore, members of the wafer treatment apparatus identical to those shown in FIG. 9 are denoted by the same reference numerals, and redundant description is not repeated.

Figure 19:
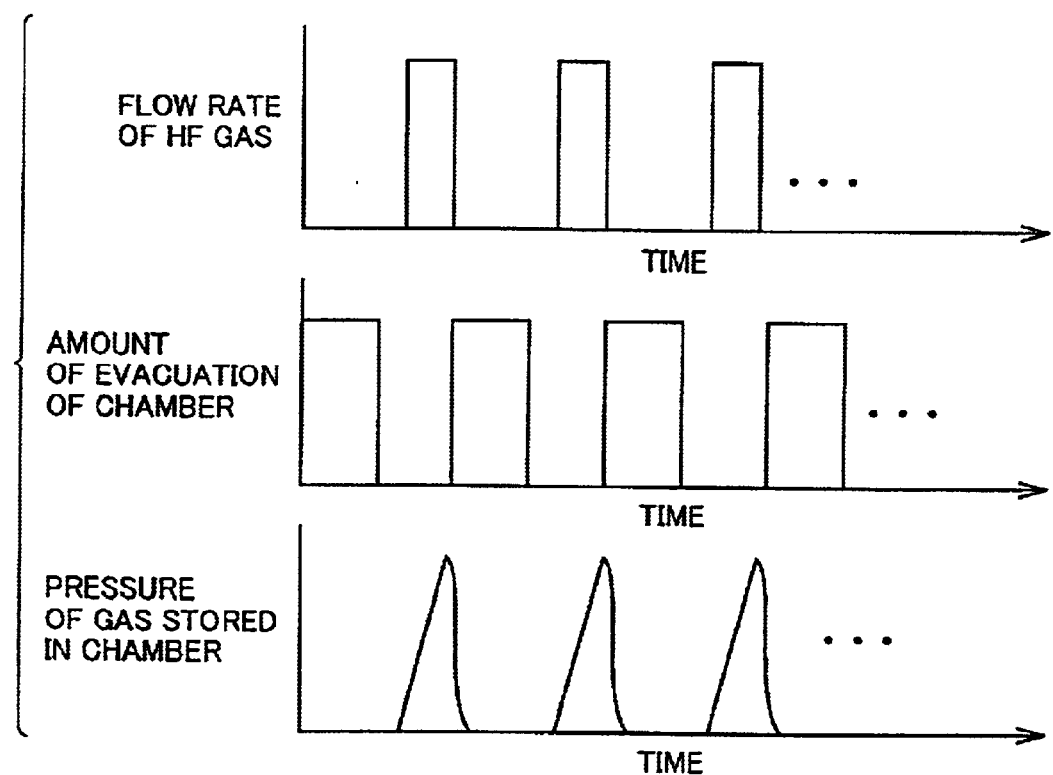
FIG. 19 is a diagram for illustrating a treatment method according to the fifth embodiment.

The control part 11 controls opening/closing of the pulse valve 6 and the evacuation pulse valve 9, for alternately supplying hydrofluoric acid gas and evacuating the chamber 1. As shown in FIG. 19, the chamber 1 is not evacuated while the same is supplied with hydrofluoric acid gas, and no hydrofluoric acid gas is supplied while the chamber 1 is evacuated.

Thus, the chamber 1 is not evacuated while the same is supplied with the hydrofluoric acid gas, whereby the internal pressure of the chamber 1 supplied with the hydrofluoric acid gas is increased as compared with the case where the same is regularly evacuated. Thus, etching is so prompted that a reaction product 26 can be efficiently removed.

The method of fabricating a semiconductor device with this wafer treatment apparatus is now described.

After steps similar to those shown in FIGS. 2 to 5 described with reference to the first embodiment, a wafer to which the reaction product 26 adheres is placed on a stage 3 of the wafer treatment apparatus.

As shown in FIG. 19, the evacuation pipe 4 is opened for evacuating the chamber 1 and bringing the same into a prescribed vacuum state, and thereafter this evacuation is stopped. Then, the pulse valve 6 for hydrofluoric acid gas is opened for supplying hydrofluoric acid gas (HF) into the chamber 1.

In this case, the hydrofluoric acid gas pulse valve 6 is opened by a time t longer than a time t1 up to starting of etching of the reaction product 26 and shorter than a time t2 up to starting of etching of a silicon oxide film 22 for supplying hydrofluoric acid gas (first time) into the chamber 1.

As shown in FIG. 19, the chamber 1 is not evacuated while the same is supplied with the hydrofluoric acid gas. The pressure of gas stored in the chamber 1 is increased due to the supply of the hydrofluoric acid gas.

The supplied hydrofluoric acid gas reacts with the reaction product 26 to generate $SiF_4$ and $H_2O$, for selectively etching the reaction product 26. After the hydrofluoric acid gas is supplied for a prescribed time, the hydrofluoric acid gas pulse valve 6 is closed. Then, the evacuation pulse valve 9 is opened for evacuating the chamber 1 for a proper time. At this time, $SiF_4$ and $H_2O$ generated in the chamber 1 and water adsorbed to the reaction product 26 are discharged from the chamber 1. After the chamber 1 is evacuated for a proper time, the evacuation pulse valve 9 is closed.

Then, the hydrofluoric acid gas pulse valve 6 is opened for supplying hydrofluoric acid gas (second time) into the chamber 1. Thus, the remaining reaction product 26 is selectively removed similarly to the first etching with the hydrofluoric acid gas.

Thereafter the operation of the control part 11 controlling opening/closing of the hydrofluoric acid gas pulse valve 6 and the evacuation pulse valve 9 is repeated by a proper number of times, so that the reaction product 26 adhering to the surface of a gate electrode 23a can be substantially completely removed substantially without etching the silicon oxide film 22.

In particular, the chamber 1 is not evacuated while the same is supplied with the hydrofluoric acid gas as shown in FIG. 19, whereby the internal pressure of the chamber 1 supplied with the hydrofluoric acid gas is increased as compared with the case where the same is regularly evacuated. Thus, etching of the reaction product 26 is prompted during the first supply of the hydrofluoric acid gas, so that the reaction product 26 can be selectively substantially completely removed by repeating the aforementioned operation by a smaller number of times.

While the evacuation pipe 4 is provided with the evacuation pulse valve 9 in the wafer treatment apparatus according to this embodiment, a conductance valve or the like capable of changing conductance in the evacuation pipe 4 at a high speed may be employed in place of the evacuation pulse valve 9.

Sixth Embodiment

A sixth embodiment of the present invention is now described with reference to a wafer treatment apparatus intermittently supplying hydrofluoric acid gas and added gas and intermittently evacuating a chamber 1 and a method of fabricating a semiconductor device with the wafer treatment apparatus.

Figure 20:
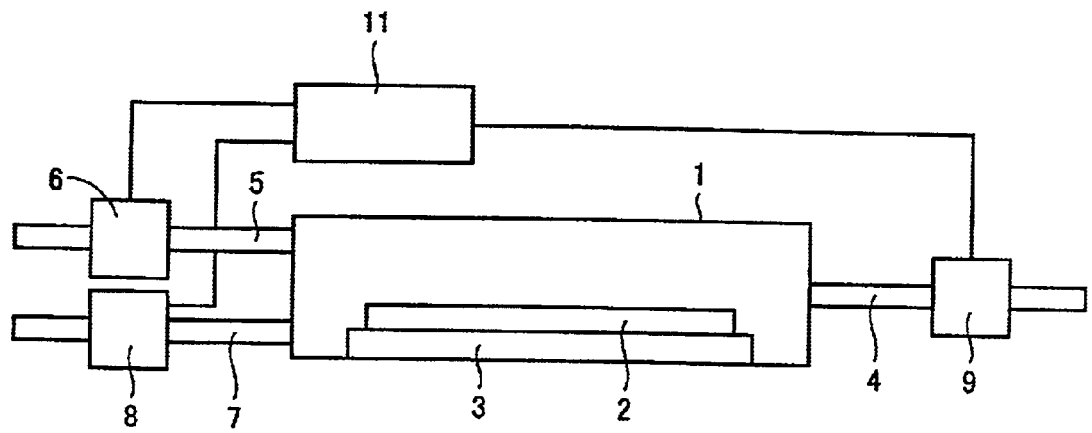
FIG. 20 is a sectional view showing a wafer treatment apparatus according to a sixth embodiment of the present invention.

As shown in FIG. 20, a hydrofluoric acid gas supply pipe 5 is provided with a hydrofluoric acid gas pulse valve 6 in this wafer treatment apparatus. Further, an added gas supply pipe 7 is provided with an added gas pulse valve 8. In addition, an evacuation pipe 4 is provided with an evacuation pulse valve 9.

A control part 11 controls opening/closing of the hydrofluoric acid gas pulse valve 6, the added gas pulse valve 8 and the evacuation pulse valve 9, for regularly supplying hydrofluoric acid gas, supplying added gas and evacuating the chamber 1.

Figure 21:
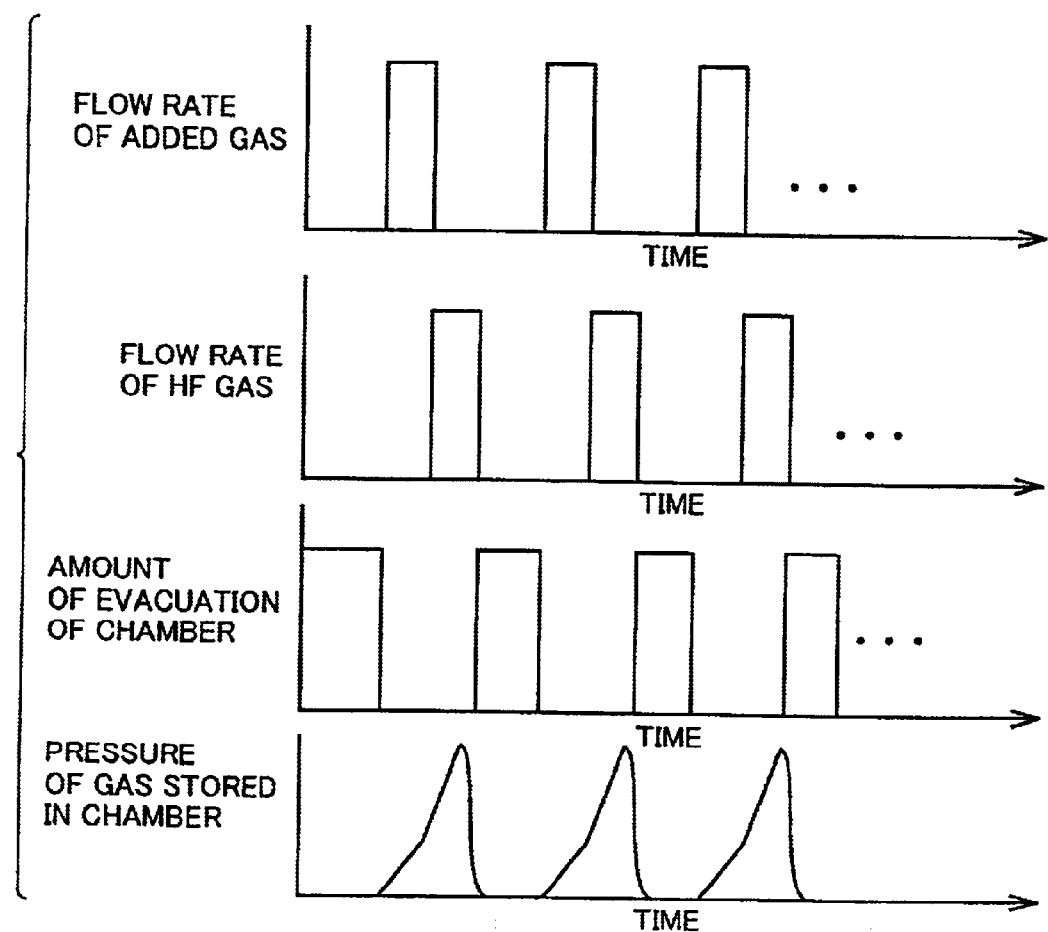
FIG. 21 is a diagram for illustrating a treatment method according to the sixth embodiment.

As shown in FIG. 21, the chamber 1 is not evacuated while the same is supplied with the hydrofluoric acid gas or the added gas, and no hydrofluoric acid gas is supplied to the chamber 1 while the added gas is supplied to the chamber 1.

The method of fabricating a semiconductor device with this wafer treatment apparatus is now described. After steps similar to those shown in FIGS. 2 to 5 described with reference to the first embodiment, a wafer to which a reaction product 26 adheres is placed on a stage of the wafer treatment apparatus.

Then, the chamber 1 is evacuated through the evacuation pipe 4 and brought into a prescribed vacuum state, and thereafter this evacuation is stopped as shown in FIG. 21. Then, the added gas pulse valve 8 is opened for supplying water vapor (first time) into the chamber 1.

Figure 22:
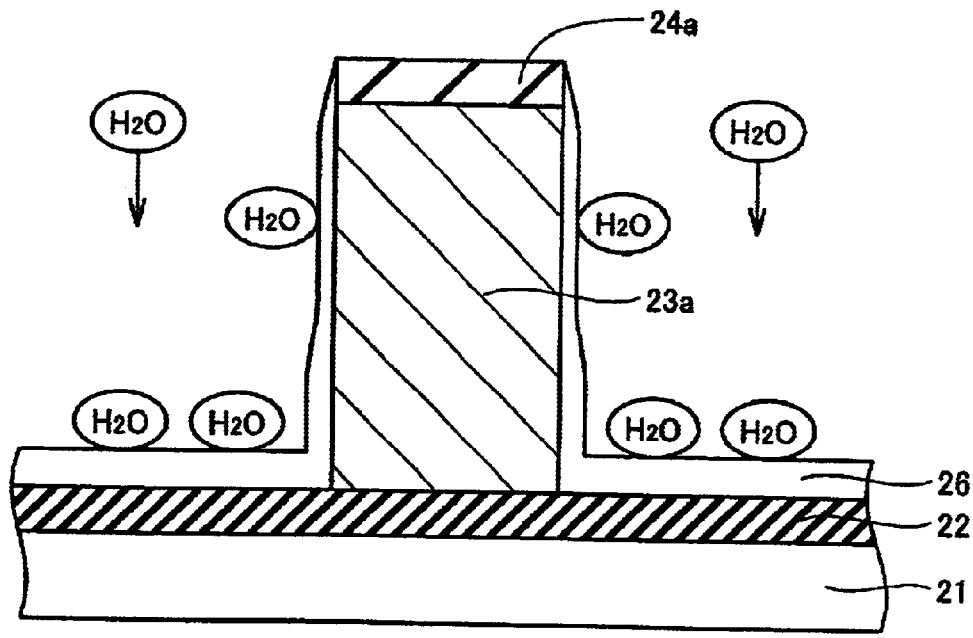
FIGS. 22 to 24 are first, second and third sectional views showing a reaction product etched in the sixth embodiment.

The hydrofluoric acid gas pulse valve 6 is opened for supplying hydrofluoric acid gas (HF) into the chamber 1 for a prescribed time. Water vapor supplied into the chamber 1 is adsorbed to the surface of the reaction product 26 as shown in FIG. 22.

Then, hydrofluoric acid gas is supplied (first time) into the chamber 1 by a time t longer than a time t1 up to starting of etching of the reaction product 26 and shorter than a time t2 up to starting of etching of a silicon oxide film 22. The internal pressure of the chamber 1 is increased due to the supply of the water vapor and the hydrofluoric acid gas, as shown in FIG. 21.

Figure 23:
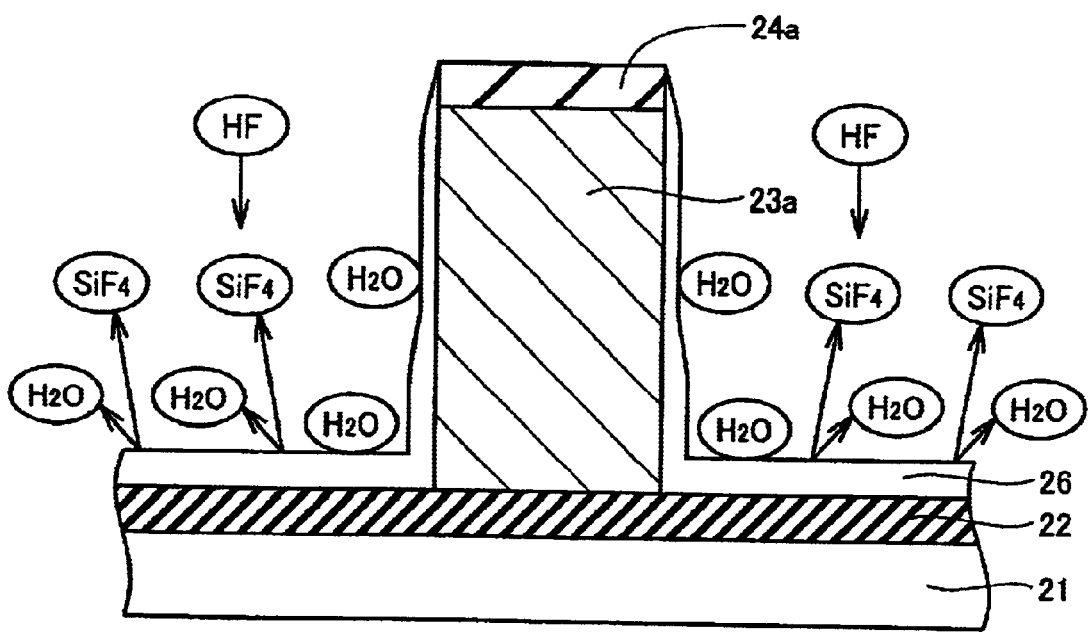

As shown in FIG. 23, the supplied hydrofluoric acid gas reacts with the reaction product 26 to generate $SiF_4$ and $H_2O$, for selectively etching the reaction product 26.

The 'chamber 1 is not evacuated while the same is supplied with the water vapor and the hydrofluoric acid gas, as shown in FIG. 21. Further, the internal pressure of the chamber 1 is increased due to the supply of the water vapor and the hydrofluoric acid gas.

Figure 24:
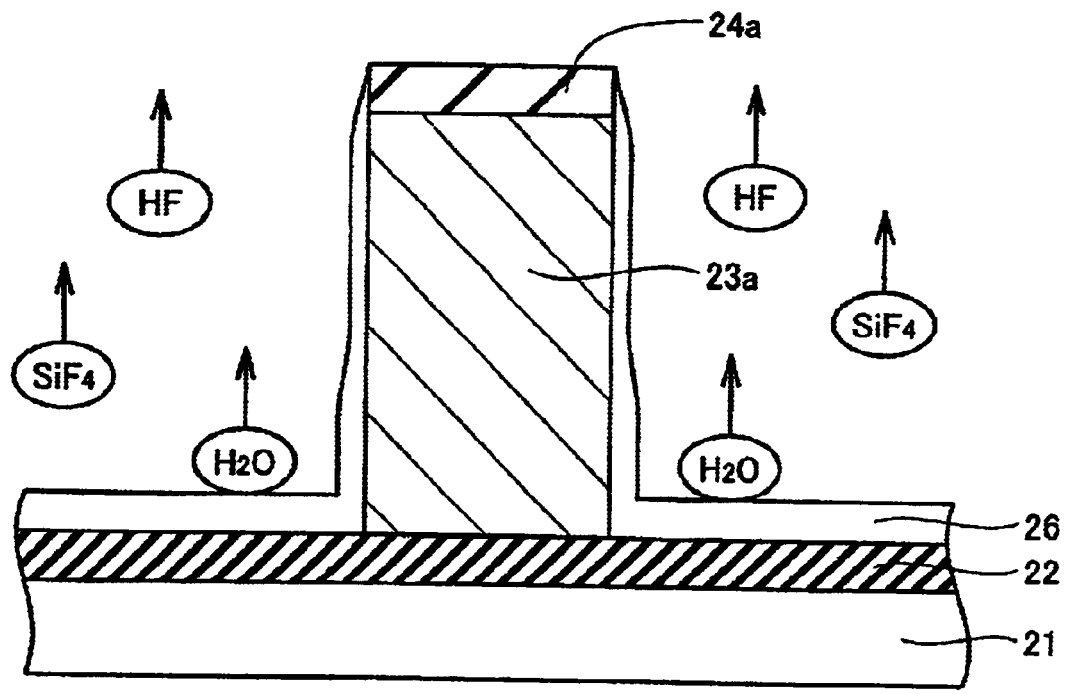

After the hydrofluoric acid gas is supplied for a prescribed time, the hydrofluoric acid gas pulse valve 6 is closed. Then, the evacuation pulse valve 9 is opened for evacuating the chamber 1 for a proper time. At this time, $SiF_4$ and $H_2O$ generated in the chamber 1 and water adsorbed to the reaction product 26 are discharged from the chamber 1 as shown in FIG. 24. After the chamber 1 is evacuated for a proper time, the evacuation pulse valve 9 is closed.

As shown in FIG. 21, the added gas pulse valve 8 is opened for supplying water vapor (second time) by a prescribed time. Then, the hydrofluoric acid gas pulse valve 6 is opened for supplying hydrofluoric acid gas (HF) (second time) into the chamber 1 for a prescribed time. Thus, the remaining reaction product 26 is selectively removed similarly to the first etching with the hydrofluoric acid gas.

Figure 25:
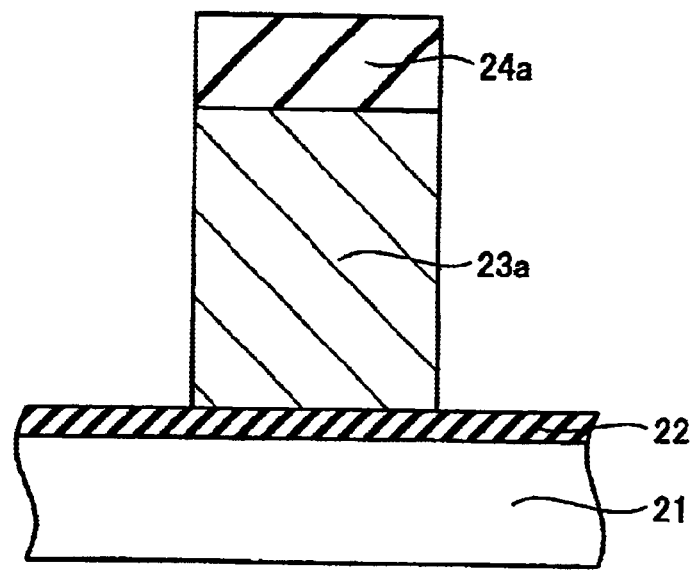
FIG. 25 is a sectional view showing a step in a method of fabricating a semiconductor device according to the sixth embodiment.

The serial operation (step) of the control part 11 controlling opening/closing of the added gas pulse valve 8, the hydrofluoric acid gas pulse valve 6 and the evacuation pulse valve 9 for supplying the added gas, supplying the hydrofluoric acid gas and evacuating the chamber 1 is repeated by a proper number of times, so that the reaction product 26 adhering to the surface of a gate electrode 23a can be substantially completely removed substantially without etching the silicon oxide film 22, as shown in FIG. 25.

Particularly according to this embodiment, water vapor is supplied before the hydrofluoric acid gas is supplied into the chamber 1 so that the time up to starting of etching of the reaction product 26 is reduced while the time up to starting of etching of the silicon oxide film 22 remains substantially unchanged as described with reference to the fourth embodiment, whereby the time T1 for substantially etching the reaction product 26 is increased regardless of the time (e.g., t2) for supplying the hydrofluoric acid gas.

Further, the chamber 1 is not evacuated while the same is supplied with the hydrofluoric acid gas and the water vapor as described with reference to the fifth embodiment, whereby the internal pressure of the chamber 1 supplied with the added gas and the hydrofluoric acid gas is increased as compared with the case where the same is regularly evacuated. Thus, etching of the reaction product 26 is prompted during supply of the hydrofluoric acid gas, and the etching rate is improved.

Thus, the time for substantially etching the reaction product 26 by supplying the hydrofluoric acid gas is increased and the etching rate is improved, whereby the reaction product 26 can be selectively substantially completely removed by repeating the aforementioned operation by a smaller number of times.

After the reaction product 26 is removed, a silicon oxide film 24a serving as a mask member shown in FIG. 25 must be removed. In this case, water vapor is first supplied into the chamber 1 followed by supply of the hydrofluoric acid gas, while the etching rate for the silicon oxide film 24a can be improved by continuously supplying the water vapor also after supplying the hydrofluoric acid gas.

Seventh Embodiment

Each of the above embodiments has been described with reference to the method of removing the reaction product adhering to the gate electrode. A seventh embodiment of the present invention is described with reference to a method of removing a mask member for patterning a gate electrode.

First, steps similar to those shown in FIGS. 2 to 6 described with reference to the first embodiment are carried out, and a wafer 2 having a silicon oxide film 24a, serving as a mask member, remaining on the upper surface of a gate electrode 23a is stored in a chamber 1 of a wafer treatment apparatus similar to that shown in FIG. 1, for example.

Figure 26:
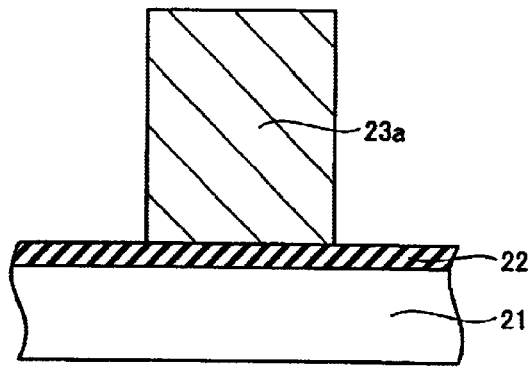
FIG. 26 is a sectional view showing a step in a method of fabricating a semiconductor device according to a seventh embodiment of the present invention.
Figure 27:
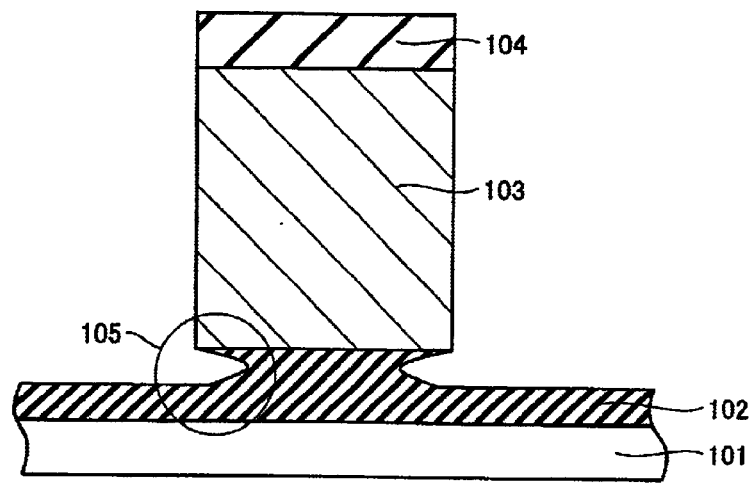
FIGS. 27 and 28 are sectional views showing steps in a conventional method of fabricating a semiconductor device.
Figure 28:
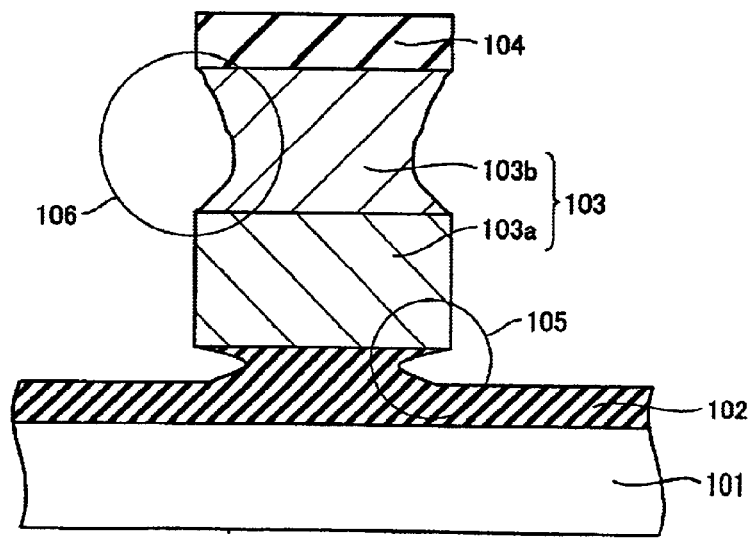
Figure 29:
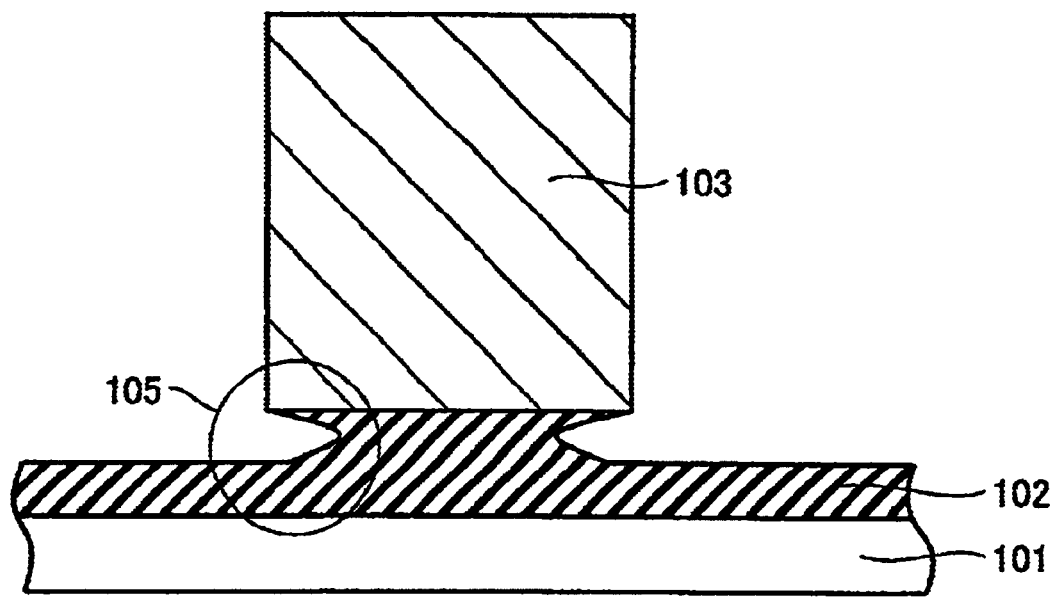
FIG. 29 is a sectional view showing still another step in the conventional method of fabricating a semiconductor device.

Then, hydrofluoric acid gas is supplied into the chamber 1. As shown in FIG. 26, the hydrofluoric acid gas comes into contact with the wafer 2 thereby reacting with the silicon oxide film 24a and etching the silicon oxide film 24a.

This etching is now described in detail. As shown in FIG. 7, there is time difference T (t2–t1) between a time t1 between supply of the hydrofluoric acid gas into the chamber 1 and starting of etching (graph A) of the silicon oxide film 24a and a time t2 for starting etching a gate insulator film 22 (graph B). In other words, etching of the silicon oxide film 24a is precedently started as compared with the gate insulator film 22.

This time difference T conceivably results from the following: The silicon oxide film 24a serving as a mask member is generally prepared from a TEOS oxide film formed by CVD, for example. On the other hand, the gate insulator film 22 is prepared from a silicon oxide film formed by thermally oxidizing a silicon substrate 21.

It is known that a TEOS oxide film has a large content of an impurity such as an OH group or water ($H_2O$) than a silicon oxide film formed by thermally oxidizing a silicon substrate.

As hereinabove described, water ($H_2O$) is generated when a silicon oxide film and hydrofluoric acid gas react with each other. When this reaction so progresses that the amount of the generated water exceeds a certain level, the rate of etching is abruptly increased. Comparing the silicon oxide film 24a serving as a mask member and the gate insulator film 22 with each other, this reaction more rapidly progresses on the silicon oxide film 24a containing a larger amount of impurity etc. than on the gate insulator film 22.

When a time t for supplying the hydrofluoric acid gas into the chamber 1 is set to be longer than the time t1 up to starting of etching of the silicon oxide film 24a and shorter than the time t2 up to starting of etching of the gate insulator film 22 as shown in FIG. 7, therefore, only the silicon oxide film 24a can be selectively etched substantially without etching the gate insulator film 22.

At this time, the gate insulator film 22 is not etched, and hence no corner portion located under the gate electrode 23a is exposed. The times t1 and t2 are preferably previously obtained by an experiment also in this case.

If it is difficult to remove the silicon oxide film 24a by single treatment, the treatment of the treatment time t may be repeated by a proper number of times as described with reference to the second embodiment, for example, so that the silicon oxide film 24a can be completely removed substantially without etching the gate insulator film 22.

The time t2 up to starting of etching of the gate insulator film 22 is set as the upper limit of the time for introducing the hydrofluoric acid gas. When neither the corner portion located under the gate electrode 23a is exposed nor a leakage current is caused even if the gate insulator film 22 is slightly etched, however, such a time can be set to the upper limit.

While the silicon oxide film 24a serving as a mask member is selectively removed with respect to the gate insulator film 22 in the above description, a reaction product 26 and the silicon oxide film 24a can be simultaneously removed if the time t1 up to starting of reaction of the reaction product 26 caused when patterning the gate electrode 23a is shorter than the treatment time t for removing the silicon oxide film 24a. Thus, cleaning after formation of the gate electrode 23a and removal of the silicon oxide film 24a serving as a mask member can be carried out in a single step.

While water vapor is employed as the gas for prompting reaction in each of the aforementioned embodiments, oxygen ($O_2$), ozone ($O_3$), nitrogen ($N_2$), inert gas such as helium (He) or neon (Ne) or alcohol such as $CH_3OH$ may alternatively be employed in place of the water vapor.

While the reaction product 26 generated when forming the gate electrode 23a is removed in each of the aforementioned embodiments, the wafer treatment apparatus according to the present invention is also applicable for selectively etching a TEOS film with respect to a thermal oxide film, selectively etching a BPTEOS (borophosphotetraethyl orthosilicate glass) film with respect to a TEOS film or selectively etching a BPSG (borophosphosilicate glass) film with respect to a PSG (phosphosilicate glass) film, for example.

For example, it has been confirmed that the difference between reaction starting times of a BPSG film and a PSG film is about 1 second and the BPSG film can be selectively etched with respect to the PSG film by setting a time for supplying hydrofluoric acid gas to not more than about 1 second.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device comprising treating a wafer in a chamber with hydrofluoric (HF) gas, a first part of the wafer having a first etching property relative to the HF gas and a second part of the wafer having a second etching property, different from the first etching property, relative to the HF gas, the method including:
   supplying the HF gas into the chamber only during a first time period,
   assuming that a time between introduction of the HF gas into the chamber and starting of etching of the first part of the wafer is a first starting time, and a time between introduction of the HF gas into the chamber and starting of etching of the second part of the wafer is a second starting time, longer than the first starting time, supplying the HF gas for a first time period, which is longer than the first starting time but shorter than the second starting time, wherein the first starting time and the second starting time correspond to respective time periods in which water is generated by reaction of the HF gas with the first part and the second part, respectively in amounts at which etching rates of the first part and the second part increase, and
   evacuating the etching gas from the chamber.

2. The method of fabricating a semiconductor device according to claim 1, wherein the time difference between the first starting time and the second starting time is not more than about 5 seconds.

3. The method of fabricating a semiconductor device according to claim 1, further comprising:
   forming a gate insulating film on the semiconductor substrate, and
   forming a gate electrode on the insulating film, wherein the first part of the wafer contains a reaction product generated before forming the gate electrode, covering the gate insulating film and the gate electrode and the second part includes said gate insulating film.

4. The method of fabricating a semiconductor device according to claim 1, including introducing a reaction accelerating gas into the chamber before supplying the HF gas, for reducing the first starting time.

5. The method of fabricating a semiconductor device according to claim 4, including alternately introducing the reaction accelerating gas and the HF gas.

6. The method of fabricating a semiconductor device according to claim 4, including continuously introducing the reaction accelerating gas into the chamber after starting supplying of the HF gas into the chamber.

7. The method of fabricating a semiconductor device according to claim 4, wherein the reaction accelerating gas is selected from the group consisting of water vapor, oxygen, ozone, nitrogen, helium, neon and an alcohol.

8. The method of fabricating a semiconductor device according to claim 1, further comprising:
   forming a conductive layer on a gate insulating film on the semiconductor substrate,
   forming a layer for defining a mask on the conductive layer,
   etching the conductive layer through a mask of the layer for defining a mask, thereby forming a gate electrode, and
   removing the layer for defining a mask remaining on the gate electrode after formation of the gate electrode, wherein
   the first part of the wafer includes the layer for defining a mask,
   the second part of the wafer includes the gate insulator film, and
   hydrofluoric acid gas is supplied as the gas for etching to remove the layer for defining a mask.

9. The method of fabricating a semiconductor device according to claim 8, including repeatedly supplying the HF gas.

10. The method of fabricating a semiconductor device according to claim 9, including evacuating the chamber, and, subsequently, alternately supplying the HF gas into the chamber and evacuating the chamber.

11. The method of fabricating a semiconductor device according to claim 1, including repeatedly supplying the HF gas into the chamber only during respective sequential first time periods separated by respective second time periods.

12. The method of fabricating a semiconductor device according to claim 11, including evacuating the HF gas from the chamber only during the second time periods.

13. The method of fabricating a semiconductor device according to claim 11, including continuously evacuating the HF gas from the chamber during the first and second time periods.

14. The method of fabricating a semiconductor device according to claim 1, including introducing a reaction accelerating gas into the chamber during a second time period, wherein the second time period immediately precedes the first time period.

15. The method of fabricating a semiconductor device according to claim 14, including repeatedly supplying, the reaction accelerating gas during respective second time periods, supplying the HF gas during respective first time periods immediately following corresponding second time periods, and evacuating the HF gas and the reaction accelerating gas from the chamber only during respective third time periods, each third time period immediately following a corresponding first time period.

16. The method of fabricating a semiconductor device according to claim 14, including repeatedly supplying the reaction accelerating gas during respective second time periods, supplying the HF gas during respective first time periods immediately following corresponding second time periods, and evacuating the HF gas and the reaction accelerating gas from the chamber continuously during the first and second time periods.

17. The method of fabricating a semiconductor device according to claim 14, wherein the reaction accelerating gas is selected from the group consisting of water vapor, oxygen, ozone, nitrogen, helium, neon, and an alcohol.

18. The method of fabricating a semiconductor device according to claim 1, wherein etching of the first part of the wafer occurs during the first time period.

* * * * *